(12) United States Patent
Kim et al.

(10) Patent No.: US 12,469,790 B2
(45) Date of Patent: Nov. 11, 2025

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Junghwa Kim, Seoul (KR); Heeseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/214,172

(22) Filed: Jun. 26, 2023

(65) Prior Publication Data

US 2023/0335501 A1 Oct. 19, 2023

Related U.S. Application Data

(63) Continuation of application No. 17/039,983, filed on Sep. 30, 2020, now Pat. No. 11,728,274.

(30) Foreign Application Priority Data

Feb. 27, 2020 (KR) .................. 10-2020-0024105

(51) Int. Cl.
*H01L 23/538* (2006.01)
*H01L 23/31* (2006.01)
*H01L 25/065* (2023.01)

(52) U.S. Cl.
CPC .......... *H01L 23/5384* (2013.01); *H01L 23/31* (2013.01); *H01L 23/5385* (2013.01); *H01L 23/5386* (2013.01); *H01L 25/0657* (2013.01)

(58) Field of Classification Search
CPC . H01L 23/5384; H01L 23/31; H01L 23/5385; H01L 23/5386; H01L 25/0657; H10B 80/00
See application file for complete search history.

(56) References Cited

U.S. PATENT DOCUMENTS 8,294,253 B2 10/2012 Ihara
8,518,746 B2 8/2013 Pagaila et al.
(Continued)

FOREIGN PATENT DOCUMENTS

JP 5188426 4/2013
KR 1215271 12/2012
(Continued)

OTHER PUBLICATIONS

Office Action dated May 9, 2024 from the Korean Intellectual Property Office (KIPO) for corresponding Korean Patent Application No. 10-2020-0024105.

*Primary Examiner* — Timor Karimy
(74) *Attorney, Agent, or Firm* — MORGAN, LEWIS & BOCKIUS LLP

(57) ABSTRACT

A semiconductor package includes a first package having a first semiconductor chip, a second semiconductor chip and a core member including a through-hole. At least one of the first and second semiconductor chips is disposed in the through-hole. An encapsulant is disposed in the through-hole. A first redistribution layer is disposed above the core member and is electrically connected to the first and second semiconductor chips. A second redistribution layer is disposed under the core member and electrically connects the first and second semiconductor chips with an external PCB. Core vias penetrate the core member and electrically connect the first and second redistribution layers. A second package is disposed on the first package and includes a third semiconductor chip. A plurality of first electrical connection structures electrically connects the first and second packages. A plurality of second electrical connection structures electrically connects the semiconductor package with the external PCB.

13 Claims, 43 Drawing Sheets

(56) References Cited

U.S. PATENT DOCUMENTS

| | | | |
|---|---|---|---|
| 8,754,514 | B2 | 6/2014 | Yu et al. |
| 9,490,167 | B2 | 11/2016 | Chen et al. |
| 9,735,131 | B2 | 8/2017 | Su et al. |
| 9,768,048 | B2 | 9/2017 | Lin et al. |
| 10,109,617 | B2 | 10/2018 | Lee et al. |
| 10,325,879 | B2 | 6/2019 | Yu et al. |
| 10,748,856 | B2 | 8/2020 | Moon et al. |
| 10,879,220 | B2 | 12/2020 | Yu et al. |
| 2010/0133704 | A1* | 6/2010 | Marimuthu ......... H01L 23/3128 257/E23.116 |
| 2017/0133351 | A1 | 5/2017 | Su et al. |
| 2018/0026022 | A1* | 1/2018 | Lee ................. H01L 23/5386 257/659 |
| 2018/0076147 | A1* | 3/2018 | Kim .................... H01L 25/0657 |
| 2019/0131241 | A1 | 5/2019 | Jeng et al. |
| 2019/0287924 | A1 | 9/2019 | Moon et al. |
| 2020/0006308 | A1* | 1/2020 | Kuo ....................... H01L 24/17 |
| 2020/0411445 | A1* | 12/2020 | Chen ................... H01L 21/4857 |
| 2021/0202358 | A1 | 7/2021 | Tsao et al. |
| 2021/0272906 | A1 | 9/2021 | Kim et al. |

FOREIGN PATENT DOCUMENTS

| | | |
|---|---|---|
| KR | 10-2018-0011445 | 2/2018 |
| KR | 10-2018-0029383 | 3/2018 |
| KR | 10-2019-0107985 | 9/2019 |

\* cited by examiner

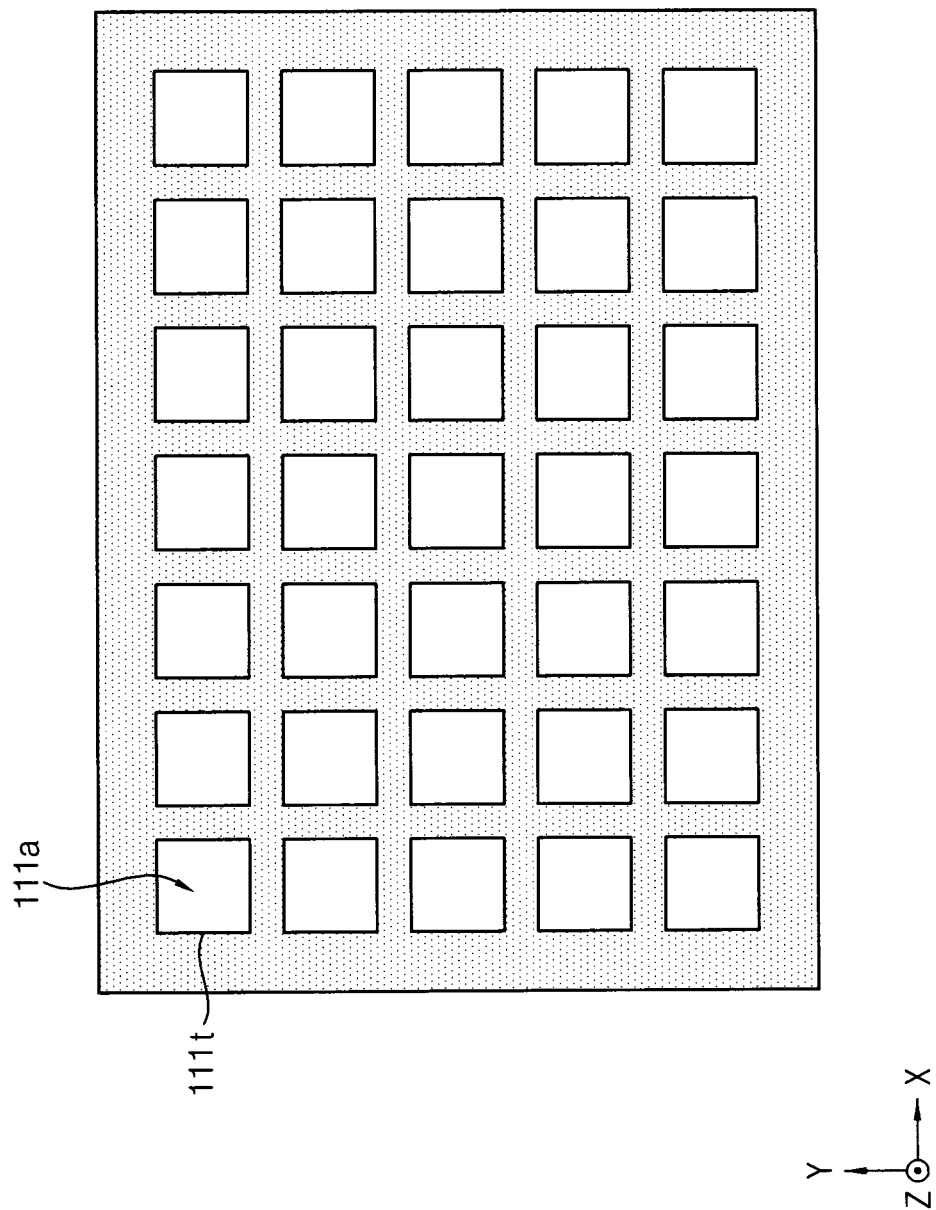

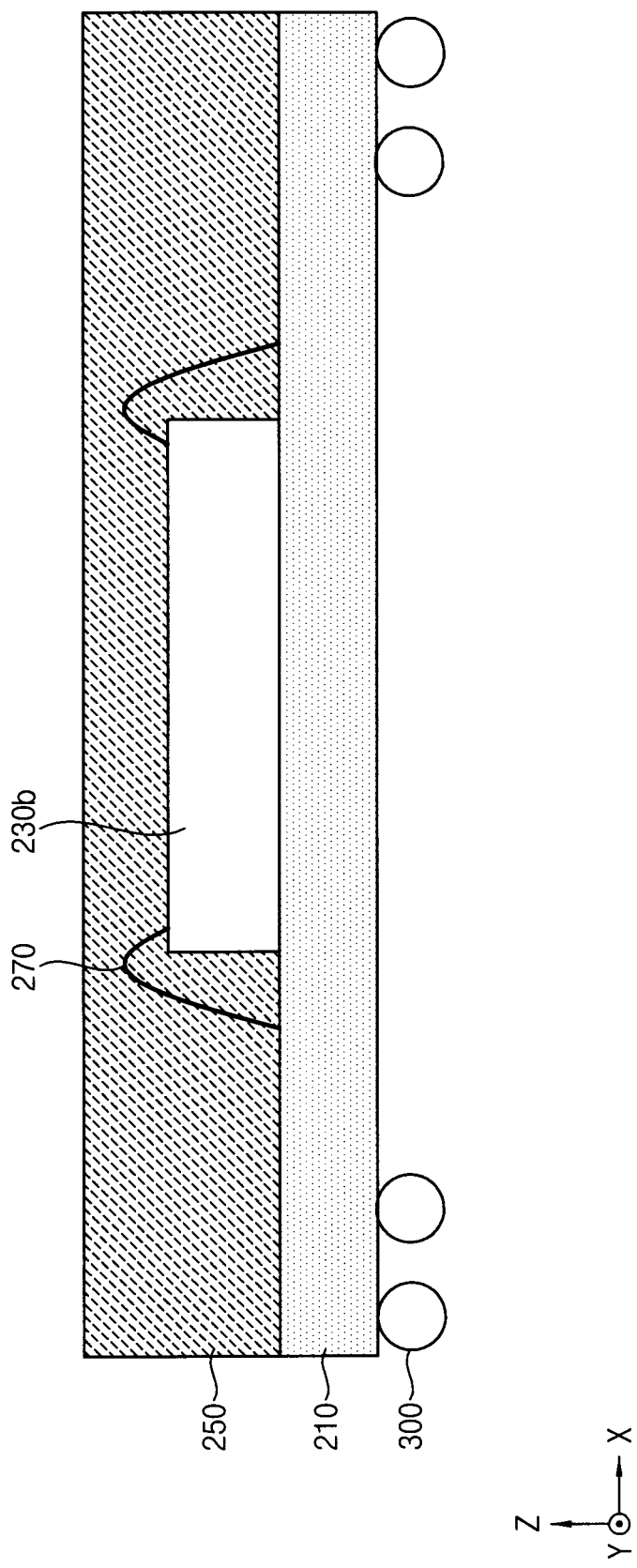

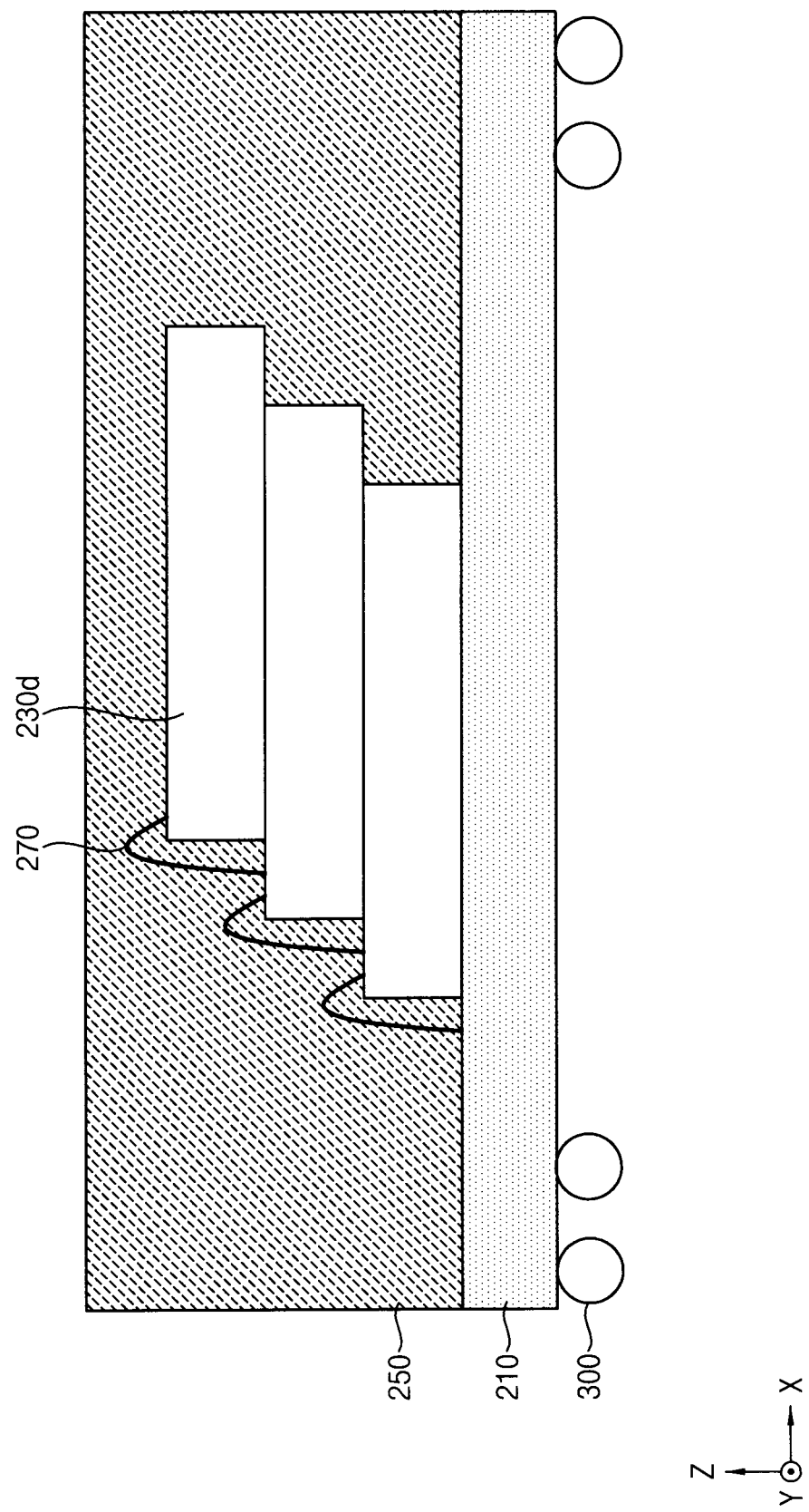

511

FIG. 11A
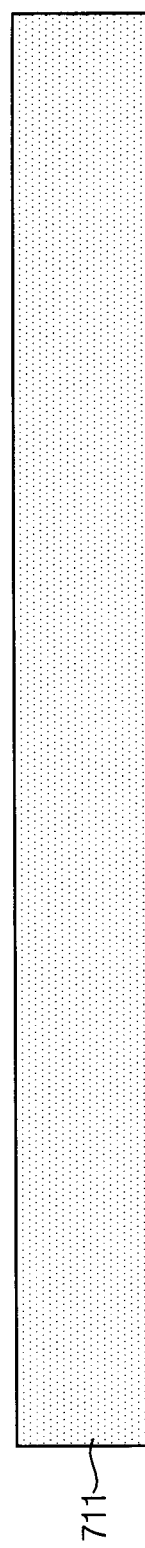
711
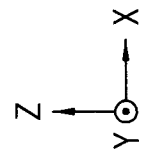

FIG. 13A
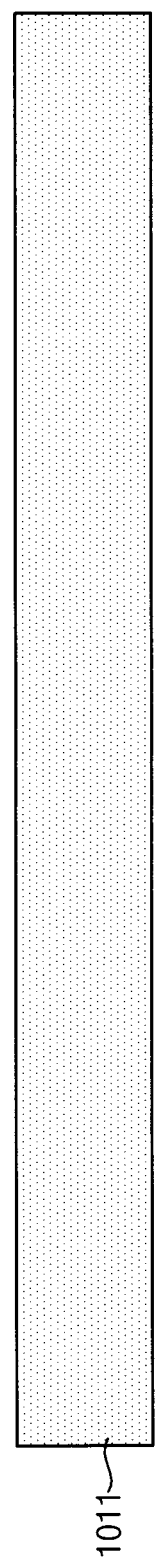
1011
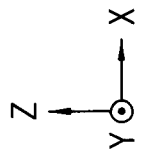

SEMICONDUCTOR PACKAGE AND METHOD OF MANUFACTURING THE SAME

CROSS-REFERENCE TO RELATED APPLICATIONS

This application is a continuation of U.S. patent application Ser. No. 17/039,983 filed on Sep. 30, 2020, which claims priority under 35 USC § 119 to Korean Patent Application No. 10-2020-0024105, filed on Feb. 27, 2020 in the Korean Intellectual Property Office, the disclosures of which are incorporated by reference in their entireties herein.

1. TECHNICAL FIELD

Exemplary embodiments relate generally to semiconductor integrated circuits, and more particularly to semiconductor packages having a highly integrated system-in-package (SIP) and methods of manufacturing the semiconductor packages.

2. DISCUSSION OF RELATED ART

A recent trend in the field of semiconductor chips has been the reduction in the size of semiconductor chips. Therefore, in the field of package technology, there has been an increased demand for semiconductor packages having a compact size while including a plurality of pins. There has been increased attention for fan-out semiconductor packages because they have a compact size and may allow a plurality of pins to be implemented by redistributing electrical connection structures outwardly of a region in which the semiconductor chip is disposed. In addition, there has been increased attention for semiconductor packages providing a multi-function/integration structure within a limited area.

SUMMARY

At least one exemplary embodiment of the present inventive concepts provides a semiconductor package that efficiently implements a highly integrated system-in-package (SIP) based on a fan-out structure.

At least one exemplary embodiment of the present inventive concepts provides a method of manufacturing a semiconductor package that efficiently implements a highly integrated SIP based on a fan-out structure.

According to an exemplary embodiment of the present inventive concepts, a semiconductor package includes a first package having a first semiconductor chip and a second semiconductor chip. A core member includes a through-hole and at least one of the first and second semiconductor chips is disposed in the through-hole. An encapsulant is disposed in the through-hole, and encapsulates the at least one of the first and second semiconductor chips disposed in the through-hole. A first redistribution layer is disposed above the core member. The first redistribution layer is electrically connected to the first and second semiconductor chips. A second redistribution layer is disposed under the core member. The second redistribution layer is configured to electrically connect the first and second semiconductor chips with an external printed circuit board (PCB). Core vias penetrate the core member. The core vias are configured to electrically connect the first redistribution layer with the second redistribution layer. A second package is disposed on the first package and includes a third semiconductor chip. A plurality of first electrical connection structures is disposed between the first package and the second package. The plurality of first electrical connection structures is configured to electrically connect the first package with the second package. A plurality of second electrical connection structures is disposed under the first package. The plurality of second electrical connection structures is configured to electrically connect the semiconductor package with the external PCB.

According to an exemplary embodiment of the present inventive concepts, a semiconductor package includes a core member including a through-hole. A first semiconductor chip and a second semiconductor chip are disposed in the through-hole. A first encapsulant is disposed in the through-hole and encapsulates the first and second semiconductor chips. A first redistribution layer is disposed above the core member. The first redistribution layer is electrically connected to at least one of the first and second semiconductor chips. A second redistribution layer is disposed under the core member. The second redistribution layer is configured to electrically connect at least one of the first and second semiconductor chips with an external printed circuit board (PCB). Core vias penetrate the core member. The core vias are configured to electrically connect the first redistribution layer with the second redistribution layer. A third semiconductor chip is disposed on the first redistribution layer. A second encapsulant is disposed on the first redistribution layer and encapsulates the third semiconductor chip. A plurality of electrical connection structures is disposed under the second redistribution layer. The plurality of electrical connection structures is configured to electrically connect the semiconductor package with the external PCB.

According to an exemplary embodiment of the present inventive concepts, a method of manufacturing a semiconductor package includes fabricating a first package including a first semiconductor chip and a second semiconductor chip. A second package is fabricated that includes a third semiconductor chip. The first package is electrically connected with the second package by disposing the second package on the first package and including a plurality of first electrical connection structures that are configured to electrically connect the first package with the second package. The fabricating of the first package includes providing a core member, forming a through-hole and via-holes penetrating the core member, forming core vias in the via-holes, disposing at least one of the first and second semiconductor chips in the through-hole, and forming an encapsulant in the through-hole. The encapsulant encapsulates the at least one of the first and second semiconductor chips disposed in the through-hole. A first redistribution layer is formed above the core member. The first redistribution layer is electrically connected to the first and second semiconductor chips. A second redistribution layer is formed under the core member. The second redistribution layer is configured to electrically connect the first and second semiconductor chips with an external printed circuit board (PCB). The core vias are configured to electrically connect the first redistribution layer and the second redistribution layer to each other. A plurality of second electrical connection structures is formed under the second redistribution layer. The plurality of second electrical connection structures are configured to electrically connect the semiconductor package with the external PCB.

According to an exemplary embodiment of the present inventive concepts a method of manufacturing a semiconductor package includes forming a through-hole and via-holes penetrating the core member. Core vias are formed in the via-holes. A first redistribution layer and a second redistribution layer are electrically connected to each other by the core vias. A first semiconductor chip and a second semiconductor chip are both disposed in the through-hole. A first encapsulant is formed in the through-hole. The first and second semiconductor chips are encapsulated by the first encapsulant. The first redistribution layer is formed on the core member. The first redistribution layer is electrically connected to at least one of the first and second semiconductor chips. The second redistribution layer is formed under the core member. The second redistribution layer electrically connects the at least one of the first and second semiconductor chips with an external printed circuit board (PCB). A third semiconductor chip is disposed on the first redistribution layer. A second encapsulant is formed on the first redistribution layer. The third semiconductor chip is encapsulated by the second encapsulant. A plurality of electrical connection structures are formed under the second redistribution layer. The plurality of electrical connection structures electrically connect the semiconductor package with the external PCB.

The semiconductor package according to exemplary embodiments of the present inventive concepts may be implemented with a PoP scheme in which one package implemented as a fan-out scheme is used as a substrate and another package is disposed on the one package. In addition, a plurality of semiconductor chips in the one package may be stacked in a vertical direction, or the plurality of semiconductor chips in the one package may be arranged side by side in a horizontal direction and one of the plurality of semiconductor chips is implemented as a 3D integration semiconductor chip. Alternatively, one package implemented as a fan-out scheme may be used as a substrate, another semiconductor chip may be disposed on the one package, and a redistribution layer in the one package may be used as a substrate for the placement of the another semiconductor chip. Accordingly, a multi-function/integration structure may be efficiently implemented within a limited package area.

BRIEF DESCRIPTION OF THE DRAWINGS

Illustrative, non-limiting exemplary embodiments will be more clearly understood from the following detailed description taken in conjunction with the accompanying drawings.

FIGS. 3A, 3B, 3C, 3D, 3E, 3F, 3G, 3H, 4, 5A, 5B, 5C and 6 are cross-sectional views for describing a method of manufacturing a semiconductor package of FIG. 1 according to exemplary embodiments of the present inventive concepts.

FIGS. 7A, 7B, 7C and 7D are cross-sectional views of a second package included in a semiconductor package according to exemplary embodiments of the present inventive concepts.

FIGS. 11A, 11B, 11C, 11D, 11E and 11F are cross-sectional views for describing a method of manufacturing a semiconductor package of FIG. 10 according to exemplary embodiments of the present inventive concepts.

FIGS. 13A, 13B, 13C, 13D, 13E, 13F and 13G are cross-sectional views for describing a method of manufacturing a semiconductor package of FIG. 12 according to exemplary embodiments of the present inventive concepts.

DETAILED DESCRIPTION OF EXEMPLARY EMBODIMENTS

Figure 1:
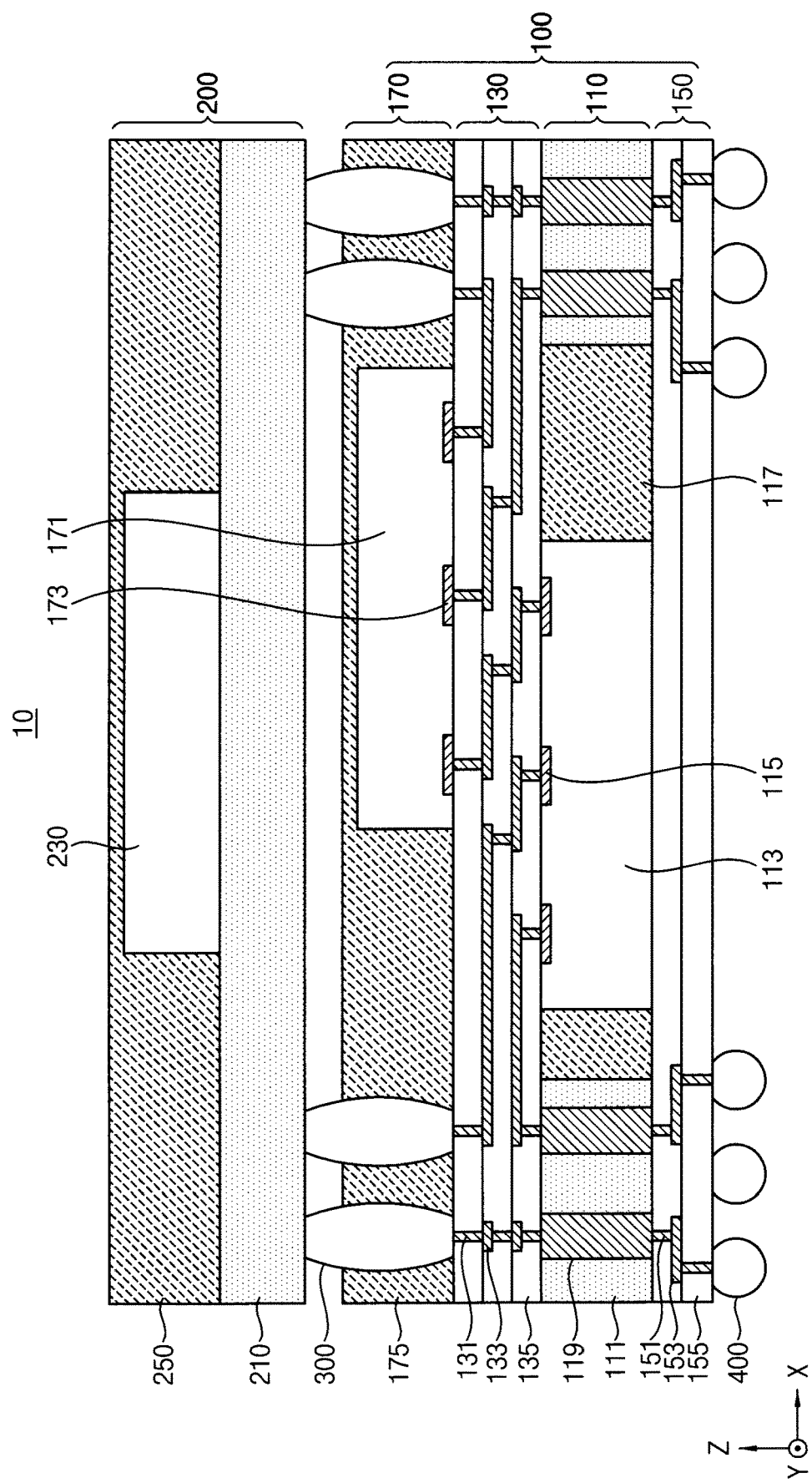
FIG. 1 is a cross-sectional view of a semiconductor package according to an exemplary embodiment of the present inventive concepts.

Various exemplary embodiments will be described more fully with reference to the accompanying drawings. The present inventive concepts may, however, be embodied in many different forms and should not be construed as limited to the exemplary embodiments set forth herein. Like reference numerals refer to like elements throughout this application.

FIG. 1 is a cross-sectional view of a semiconductor package according to an exemplary embodiment of the present inventive concepts.

In FIG. 1, two directions substantially parallel to a first surface (e.g., a top surface) of a package substrate and crossing each other are referred to as the X direction (e.g., a first horizontal direction) and a Y direction (e.g., a second horizontal direction). In addition, a direction substantially vertical to the first surface of the package substrate is referred to as a Z direction (e.g., a vertical direction). For example, in the exemplary embodiment of FIG. 1, the X and Y directions are substantially perpendicular to each other. However, in other exemplary embodiments, the X and Y directions may cross each other at any other angle. In addition, as shown in the exemplary embodiment of FIG. 1, the Z direction may be substantially perpendicular to both the X and Y directions. However, in another exemplary embodiment, the Z direction may cross the X and Y directions at any other angle. Further, a direction indicated by an arrow in the figures and a reverse direction thereof are considered as the same direction. The definition of the X, Y and Z directions are the same in the subsequent figures.

Referring to the exemplary embodiment of FIG. 1, a semiconductor package 10 includes a first package 100 that includes a first semiconductor chip 113 and a second semiconductor chip 171, a second package 200 that includes a third semiconductor chip 230 and is disposed on the first package 100 (e.g., in the Z direction). The semiconductor package 10 further includes a plurality of first electrical connection structures 300, and a plurality of second electrical connection structures 400.

The first package 100 includes a core layer 110, a first redistribution layer 130, a second redistribution layer 150 and a first layer 170.

The core layer 110 includes a core member 111, the first semiconductor chip 113, an encapsulant 117 and core vias 119.

The core member 111 maintains rigidity of the first package 100 depending on a specific material of the core member 111. The core member 111 includes a through-hole (e.g., a through-hole 111a in FIG. 3B) in which at least one of the first and second semiconductor chips 113 and 171 is disposed. In the exemplary embodiment shown in FIG. 1, only the first semiconductor chip 113 may be disposed inside the through-hole 111a of the core member 111. The core member 111 may be referred to as a package substrate.

As shown in the exemplary embodiment of FIG. 1, the first semiconductor chip 113 is disposed in the through-hole 111a of the core member 111. The first semiconductor chip 113 may include a first active surface having first pads 115 disposed thereon and a first inactive surface opposite to the first active surface. For example, as shown in the exemplary embodiment of FIG. 1, the first active surface is an upper surface of the first semiconductor chip 113 and the first inactive surface may be opposite thereto (e.g., in the Z direction).

The encapsulant 117 is formed in the through hole 111a of the core member 111, and encapsulates the at least one of the first and second semiconductor chips 113 and 171 disposed in the through hole 111a. For example, the encapsulant 117 may surround lateral ends of the at least one of the first and second semiconductor chips 113 and 171 disposed in the through hole 111a (e.g., in the X direction). In the exemplary embodiment of FIG. 1, only the first semiconductor chip 113 is disposed in the through hole 111a and may be encapsulated by the encapsulant 117.

The core vias 119 penetrate the core member 111 and extend therethrough in the Z direction. The core vias 119 electrically connect the first redistribution layer 130 with the second redistribution layer 150. Thus, electrical paths may be formed by the core vias 119 in the core layer 110.

The first redistribution layer 130 is disposed on the core member 111, and is electrically connected to at least one of the first and second semiconductor chips 113 and 171. For example, as shown in the exemplary embodiment of FIG. 1, the first redistribution layer 130 is disposed above the core member 111. A lower surface of the first redistribution layer 130 may directly contact an upper surface of the core member 111. The first redistribution layer 130 may include a plurality of vias 131 and a plurality of wirings 133 for redistributing the first pads 115 of the first semiconductor chip 113 and second pads 173 of the second semiconductor chip 171, and may include a plurality of insulating layers 135 for electrically insulating at least portions of the plurality of wirings 133. In the exemplary embodiment of FIG. 1, the first redistribution layer 130 is electrically connected to both the first and second semiconductor chips 113, 171. However, in other exemplary embodiments, the first redistribution layer 130 may be electrically connected to at least one of the first and second semiconductor chips 113, 171. In the exemplary embodiment of FIG. 1, the first redistribution layer 130 includes three insulating layers 135. However, exemplary embodiments of the present inventive concepts are not limited thereto.

Figure 2A:
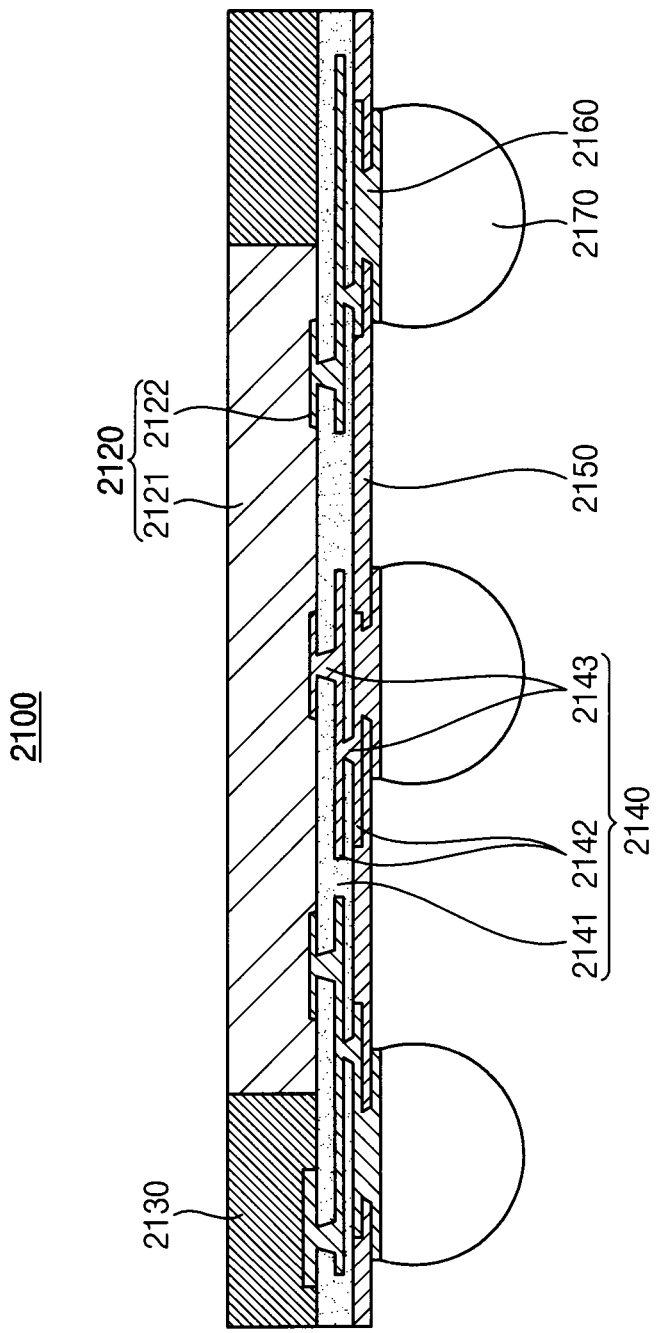
FIGS. 2A and 2B are diagrams for describing a structure of a fan-out package included in a semiconductor package according to exemplary embodiments of the present inventive concepts.
Figure 2B:
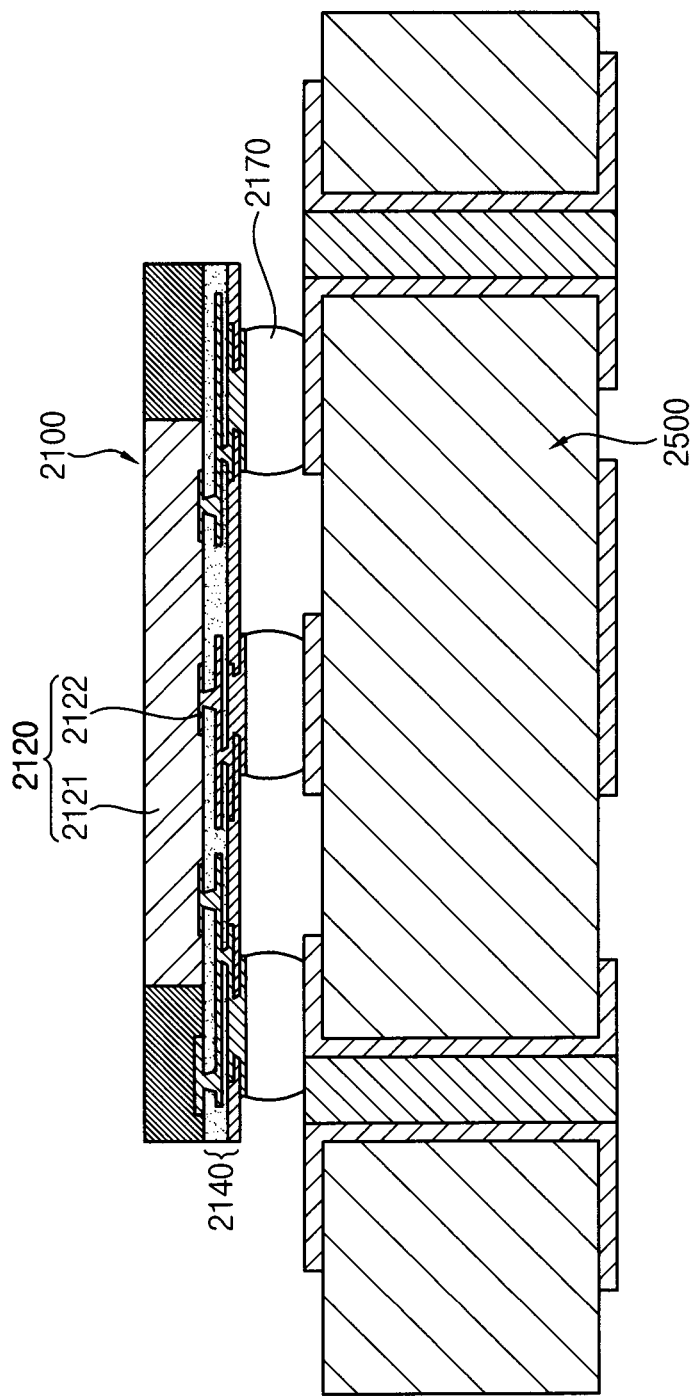

The second redistribution layer 150 is disposed under the core member 111 (e.g., in the Z direction), and electrically connects at least one of the first and second semiconductor chips 113 and 171 with an external printed circuit board (PCB) (e.g., an external PCB 2500 in FIG. 2B). The second redistribution layer 150 may include a plurality of vias 151 and a plurality of wirings 153 for redistributing the first and second pads 115 and 173 of the first and second semiconductor chips 113 and 171 or for electrical connection with the external PCB, and may include a plurality of insulating layers 155 for electrically insulating at least portions of the plurality of wirings 153. For example, in the exemplary embodiment of FIG. 1, the second redistribution layer 150 includes two insulating layers 155. However, exemplary embodiments of the present inventive concepts are not limited thereto.

In an exemplary embodiment, the core vias 119, the vias 131 and 151, and the wirings 133 and 153 may include vias and wirings for ground (GND), vias and wirings for power (PWR), and vias and wirings for signals, and the like. The vias and wirings for signals may include vias and wirings for various signals other than the ground and the power, such as data signals, and the like.

The first layer 170 is disposed on the first redistribution layer 130. For example, as shown in the exemplary embodiment of FIG. 1, a lower surface of the first layer 170 may directly contact an upper surface of the first redistribution layer 130. The first layer 170 includes the second semiconductor chip 171 and an encapsulant 175.

The second semiconductor chip 171 is disposed on the first redistribution layer 130. The second semiconductor chip 171 may include a second active surface having the second pads 173 disposed thereon and a second inactive surface opposite to the second active surface. For example, as shown in the exemplary embodiment of FIG. 1, the second active surface may be on the lower surface of the second semiconductor chip 171 and the second inactive surface may be on the upper surface of the second semiconductor chip 171.

The encapsulant 175 is formed on the first redistribution layer 130, and encapsulates the second semiconductor chip 171. For example, as shown in the exemplary embodiment of FIG. 1, the encapsulant 175 may directly contact upper and lateral sides (e.g., in the X direction) of the second semiconductor chip 171. However, exemplary embodiments of the present inventive concepts are not limited thereto.

In an exemplary embodiment each of the first and second semiconductor chips 113 and 171 may be an integrated circuit (IC) in a bare state, that are provided in an amount of several hundreds to several millions of elements or more integrated in a single chip. Each semiconductor chip may include a body on which various circuits are formed, and pads may be formed on an active surface of the body. In an exemplary embodiment, the body may be formed on the basis of an active wafer, and silicon (Si), germanium (Ge), gallium arsenide (GaAs), or the like, may be used as a basic material of the body. The pads may electrically connect each semiconductor chip to other components, and the pads may be composed of one or more conductive materials such as aluminum (Al) and the like. However, exemplary embodiments of the present inventive concepts are not limited thereto. In an exemplary embodiment, a passivation layer having openings exposing at least portions of the pads and formed of an oxide layer, a nitride layer, or the like, may be formed on the active surface of each semiconductor chip. For example, a pad may be a contact pad or a contact pin. However, exemplary embodiments of the present inventive concepts are not limited thereto. In addition, although not illustrated in the exemplary embodiment of FIG. 1, solder bumps for electrical connection may be formed on the pads of each semiconductor chip.

In an exemplary embodiment, the first and second semiconductor chips 113 and 171 may be semiconductor chips of different types. For example, in an exemplary embodiment, one of the first and second semiconductor chips 113 and 171 may include an application processor (AP), and the other of the first and second semiconductor chips 113 and 171 may include a power management integrated circuit (PMIC). However, exemplary embodiments of the present inventive concepts are not limited thereto, and the types of the first and second semiconductor chips 113 and 171 may vary in other exemplary embodiments. In addition, although FIG. 1 illustrates only one first semiconductor chip 113 and only one second semiconductor chip 171, the number of the first and second semiconductor chips 113, 171 may vary in other exemplary embodiments.

In an exemplary embodiment, the first semiconductor chip 113 may be disposed in face-up form such that the first active surface is directed toward (e.g., faces) the second package 200, and the second semiconductor chip 171 may be disposed in face-down form such that the second inactive surface is directed toward (e.g., faces) the second package 200. However, exemplary embodiments of the present inventive concepts are not limited thereto. For example, in another exemplary embodiment, the first semiconductor chip 113 may be disposed in face-down form such that the first inactive surface is directed toward (e.g., faces) the second package 200.

In an exemplary embodiment, the first package 100 may be a fan-out package (or a fan-out semiconductor package). The signal paths in the fan-out package may be reduced by forming the signal paths by the vias 131 and 151 and the wirings 133 and 153 in the first and second redistribution layers 130 and 150, rather than by wire bondings, and thus the signal loss may also be reduced. For example, the electrical characteristics of signals may be improved or enhanced in the fan-out package. The fan-out package may have an increased reliability as compared to a fan-in package, may implement a plurality of input/output (I/O) terminals, and may facilitate a three-dimensional (3D) interconnection. In addition, as compared to a ball grid array (BGA) package, a land grid array (LGA) package, or the like, the fan-out package may be manufactured to have a relatively small thickness, and may be cost effective to manufacture.

In an exemplary embodiment, the core member 111 included in the first package 100 may include a PCB substrate (or a PCB panel), and thus the first package 100 may be a panel level package (PLP). Unlike a wafer level package (WLP) which is manufactured based on a wafer, the PLP may be manufactured based on the PCB substrate (e.g., manufactured by forming holes penetrating the PCB substrate, by disposing a semiconductor chip in some of the holes, and by forming core vias in others of the holes), and thus the core member 111 for the rigidity of the package and the encapsulant 117 for the protection and/or insulation of the semiconductor chip may coexist in the core layer 110. As compared with the WLP, the PLP may have relatively high productivity, may have relatively high reliability such as a high impact resistance and increased bending characteristics, and may be relatively easy to implement an integrated package including various components.

The first package 100 included in the semiconductor package 10 according to an exemplary embodiment may be a fan-out panel level package in which the fan-out package and the PLP are combined or merged.

The plurality of second electrical connection structures 400 are disposed under the first package 100 (e.g., in the Z direction), and electrically connect the semiconductor package 10 with an external element. For example, in an exemplary embodiment, the semiconductor package 10 may be mounted on the external PCB through the plurality of second electrical connection structures 400.

In an exemplary embodiment, at least one of the plurality of second electrical connection structures 400 may be disposed in a fan-out region of the fan-out package. The fan-out region may represent a region other than a region in which the first and second semiconductor chips 113 and 171 are disposed.

The second package 200 is disposed on the first package 100. For example, as shown in the exemplary embodiment of FIG. 1, a lower surface of the second package 200 may directly contact an upper surface of the first package 100. The second package 200 includes the third semiconductor chip 230. The second package 200 may further include a substrate 210 and an encapsulant 250.

The substrate 210 may support the third semiconductor chip 230. The substrate 210 may be referred to as a package substrate. The third semiconductor chip 230 may be disposed on the substrate 210. The encapsulant 250 may be formed on the substrate 210, and may encapsulate the third semiconductor chip 230. For example, the encapsulant 250 may surround lateral ends of the third semiconductor chip 230 (e.g., in the X direction).

Similar to the first and second semiconductor chips 113 and 171, the third semiconductor chip 230 may include a body on which various circuits are formed, and pads that electrically connect the third semiconductor chip 230 to other components. In an exemplary embodiment, the substrate 210 may include a PCB substrate, and may include vias and wirings for electrical connection with the third semiconductor chip 230 and other components.

In an exemplary embodiment, the third semiconductor chip 230 may be a semiconductor chip of a different type from the first and second semiconductor chips 113 and 171. For example, the third semiconductor chip 230 may include a memory device. For example, the memory device may include at least one of various volatile memory devices, such as a dynamic random access memory (DRAM), a static random access memory (SRAM), or the like, and/or at least one of various nonvolatile memory devices, such as an electrically erasable programmable read-only memory (EEPROM), a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like. In an exemplary embodiment, the third semiconductor chip 230 may further include a memory controller that controls the memory device. However, exemplary embodiments of the present inventive concepts are not limited thereto, and a type of the third semiconductor chip 230 may vary in other exemplary embodiments. In addition, although the exemplary embodiment of FIG. 1 illustrates only one third semiconductor chip 230, the number of semiconductor chips may be a plurality of semiconductor chips of varying amounts in other exemplary embodiments.

In an exemplary embodiment, as will be described with reference to FIGS. 7A, 7B, 7C and 7D, the second package 200 may be implemented in various manners.

The plurality of first electrical connection structures 300 are disposed between the first package 100 and the second package 200, and electrically connect the first package 100 with the second package 200. For example, the plurality of first electrical connection structures 300 may penetrate the encapsulant 175 and for electrical connection with the first redistribution layer 130. The exemplary embodiment of FIG. 1 includes four first electrical connection structures 300. However, exemplary embodiments of the present inventive concepts are not limited thereto and the number of the first electrical connection structures 300 may vary in other exemplary embodiments.

The first to third semiconductor chips 113, 171 and 230 may be electrically connected to each other, and the first to third semiconductor chips 113, 171 and 230 and external components may be electrically connected to each other by the core vias 119, the vias 131 and 151 and the wirings 133 and 153 in the first and second redistribution layers 130 and 150, vias and wirings in the substrate 210, and the first and second electrical connection structures 300 and 400.

In an exemplary embodiment, the first package 100 and the second package 200 may be individually, independently and separately manufactured through separate processes, and then may be electrically connected to each other by the plurality of first electrical connection structures 300. For example, the first package 100 and the second package 200 may not be manufactured by being integrated and/or combined in a single process, but may be separately manufactured and then be electrically connected to each other to form one semiconductor package 10 in a subsequent process. Therefore, in the semiconductor package 10, the first package 100 and the second package 200 may be formed to be spaced apart from each other in the Z direction (e.g., the vertical direction), and a bottom surface of the second package 200 and a top surface of the first package 100 may be spaced apart from each other by a predetermined distance. In an exemplary embodiment, a dielectric layer including air or a dielectric material may be formed between the first package 100 and the second package 200.

The semiconductor package 10 according to an exemplary embodiment of the present inventive concepts may be implemented with a package on package (PoP) scheme in which the first package 100 implemented as a fan-out scheme is used as a substrate and the second package 200 is disposed on the first package 100. In addition, the first and second semiconductor chips 113 and 171 in the first package 100 may be formed to be stacked in the vertical direction Z while being included in different layers. Accordingly, a multi-function/integration structure may be efficiently implemented within a limited package area.

FIGS. 2A and 2B are diagrams for describing a structure of a fan-out package included in a semiconductor package according to exemplary embodiments of the present inventive concepts.

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip may not be used by itself, but may be packaged and used in an electronic device or system, or the like, in a packaged state.

The semiconductor packaging is beneficial due to the existence of a difference in a circuit width between the semiconductor chip and a printed circuit board (e.g., a mainboard) of the electronic device in terms of electrical connections. For example, a size of connection pads (or pads) in the semiconductor chip and an interval between the connection pads in the semiconductor chip are very fine. However, a size of component mounting pads in the printed circuit board used in the electronic device and an interval between the component mounting pads of the printed circuit board are significantly larger than those of the semiconductor chip. Therefore, it may be difficult to directly mount the semiconductor chip on the printed circuit board, and packaging technology for buffering a difference in a circuit width between the semiconductor chip and the printed circuit board may be beneficial.

A semiconductor package manufactured by the packaging technology may be classified as a fan-in semiconductor package (or a fan-in package) or a fan-out semiconductor package (or a fan-out package) depending on a structure and a purpose thereof.

Referring to the exemplary embodiment of FIG. 2A, the semiconductor package may be a fan-out package 2100. An outer side (e.g., lateral ends) of a semiconductor chip 2120 may be protected by an encapsulant 2130, and pads 2122 of the semiconductor chip 2120 may be redistributed outwardly of the semiconductor chip 2120 by a connection member 2140. In an exemplary embodiment, a passivation layer 2150 may further be formed on the connection member 2140. For example, the passivation layer 2150 may be formed on a lower side of the connection member 2140. An underbump metal layer 2160 may further be formed in openings of the passivation layer 2150. Solder balls 2170 may further be formed on the underbump metal layer 2160. For example, in the exemplary embodiment shown in FIG. 2A, three solder balls 2170 are formed on the underbump metal layer 2160. However, exemplary embodiments of the present inventive concepts are not limited thereto. The semiconductor chip 2120 may be an integrated circuit (IC) including a body 2121, the pads 2122, a passivation layer, and the like. The connection member 2140 may include an insulating layer 2141, redistribution layers 2142 formed on the insulating layer 2141, and vias 2143 electrically connecting the pads 2122 with the redistribution layers 2142.

As described above, the fan-out package may have a form in which I/O terminals of the semiconductor chip are redistributed and disposed outwardly of the semiconductor chip through the connection member formed on the semiconductor chip. In contrast, in a fan-in package, all I/O terminals of the semiconductor chip need to be disposed inside the semiconductor chip. Therefore, in embodiments which include a fan-in package, when a size of the semiconductor chip is decreased, a size and a pitch of the solder balls need to be decreased and a standardized ball layout may not be used in the fan-in package. On the other hand, the fan-out package has the form in which the I/O terminals of the semiconductor chip are redistributed and disposed outwardly of the semiconductor chip through the connection member formed on the semiconductor chip as described above. Therefore, even in instances in which a size of the semiconductor chip is decreased, a standardized ball layout may be used in the fan-out semiconductor package as it is and the fan-out package may be mounted on the printed circuit board of the electronic device without using a separate BGA substrate, as will be described below.

Referring to the exemplary embodiment of FIG. 2B, the fan-out package 2100 may be mounted on a printed circuit board 2500 of an electronic device through the solder balls 2170, or the like. As described above, the fan-out package 2100 may include the connection member 2140 formed on the semiconductor chip 2120 and capable of redistributing the pads 2122 to a fan-out region that is outside of a size of the semiconductor chip 2120, such that the standardized ball layout may be used in the fan-out package 2100 as it is (e.g., without modification of a size and pitch of the solder balls, etc.). As a result, the fan-out package 2100 may be mounted on the printed circuit board 2500 of the electronic device without using a separate BGA substrate, or the like.

As described above, since the fan-out package is mounted on the printed circuit board of the electronic device without using the separate BGA substrate, the fan-out package may be implemented with a thickness that is less than a thickness of the fan-in package using the BGA substrate. Therefore, the fan-out package may be miniaturized and thinned. In addition, the fan-out package may have increased thermal characteristics and electrical characteristics, such that it is particularly appropriate for a mobile product.

Figure 5A:
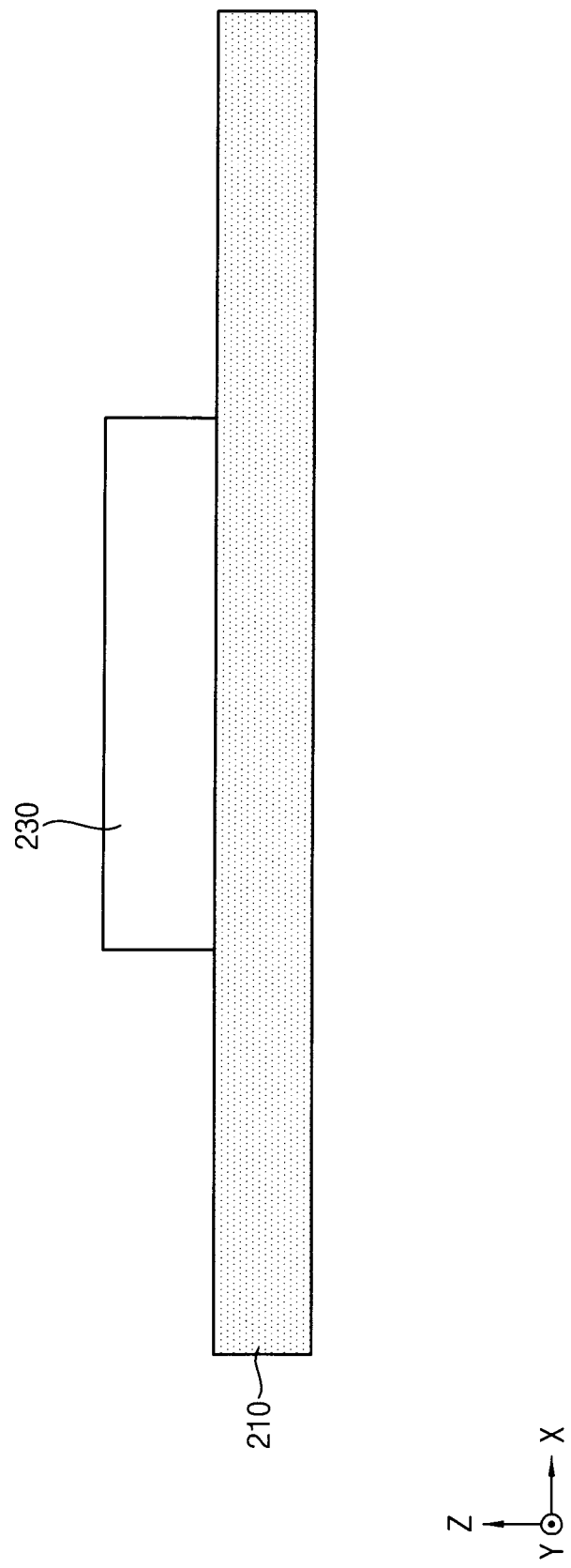
Figure 5B:
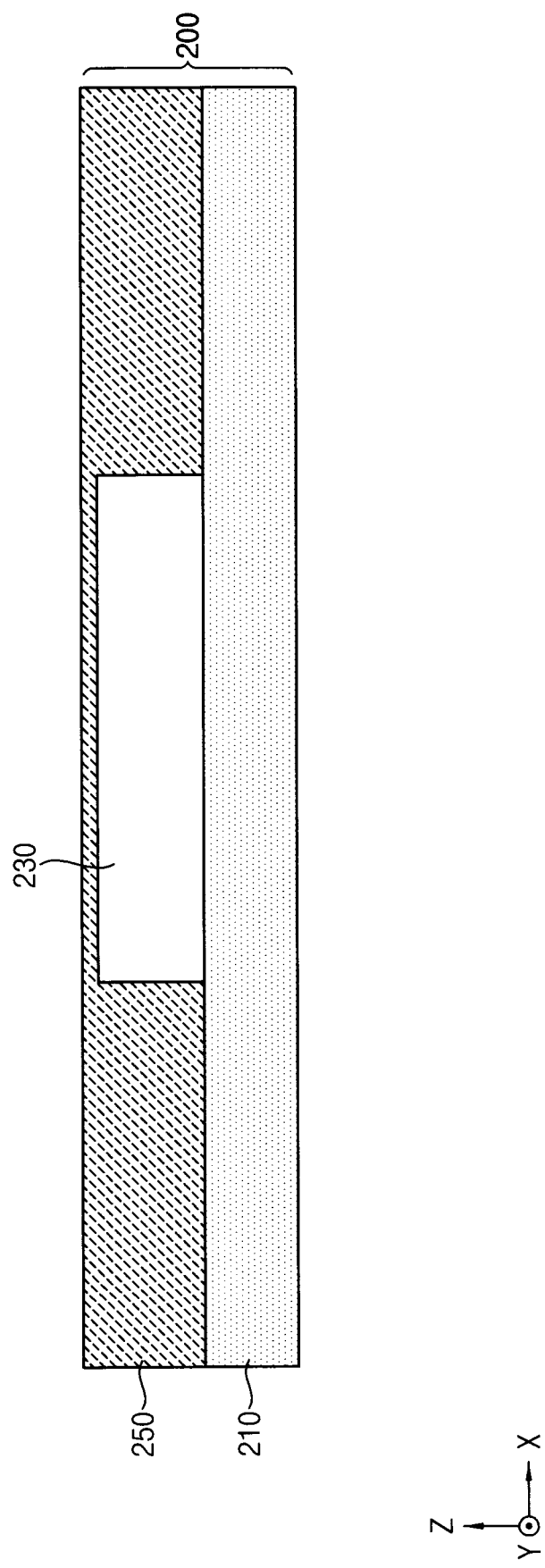
Figure 5C:
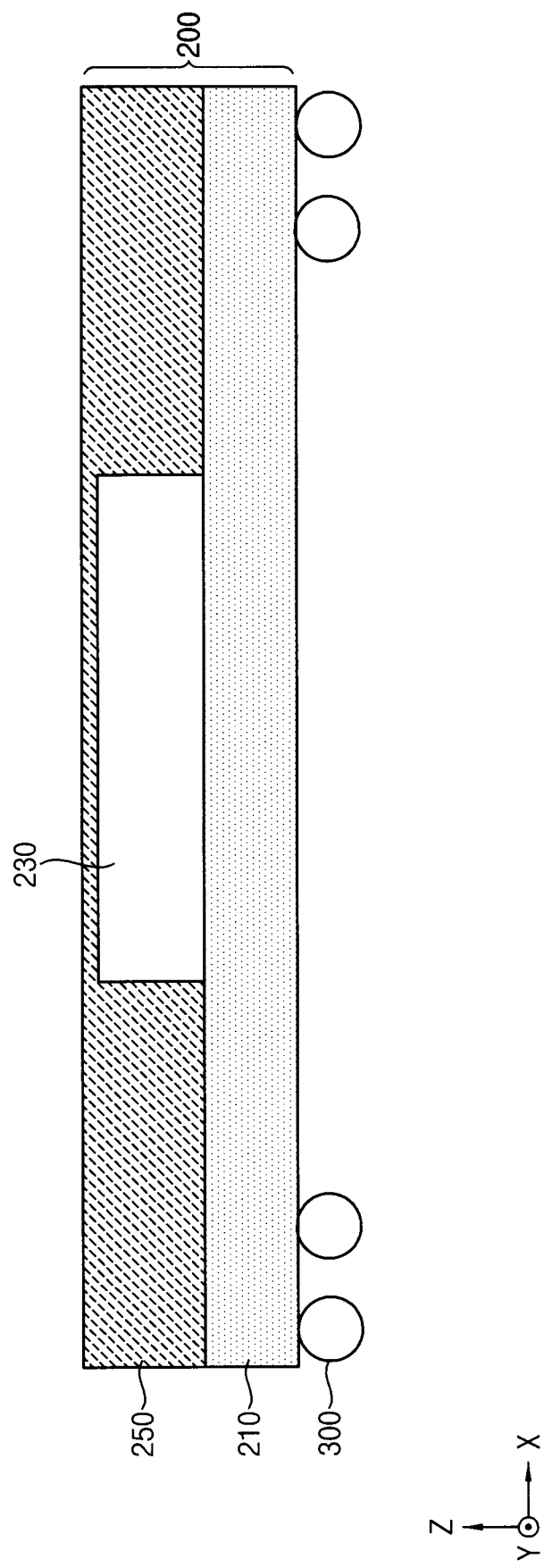
Figure 6:
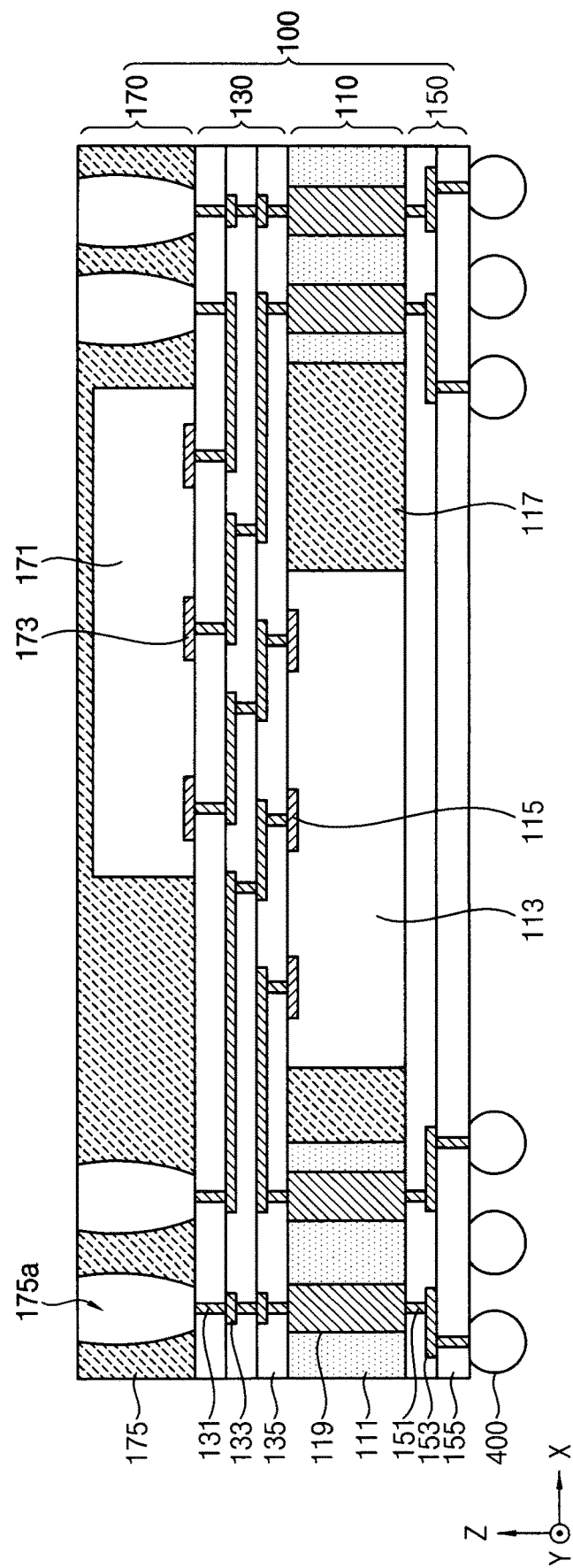

FIGS. 3A, 3B, 3C, 3D, 3E, 3F, 3G, 3H, 4, 5A, 5B, 5C and 6 are cross-sectional views for describing a method of manufacturing a semiconductor package of FIG. 1 according to exemplary embodiments of the present inventive concepts. FIGS. 3A, 3B, 3C, 3D, 3E, 3F, 3G, 3H and 4 illustrate a process of manufacturing the first package 100 in FIG. 1 according to exemplary embodiments of the present inventive concepts. FIGS. 5A, 5B and 5C illustrate a process of manufacturing the second package 200 in FIG. 1 according to exemplary embodiments of the present inventive concepts. FIG. 6 illustrates a process of electrically connecting the first package 100 with the second package 200 in FIG. 1 according to an exemplary embodiment of the present inventive concepts.

Figure 3A:
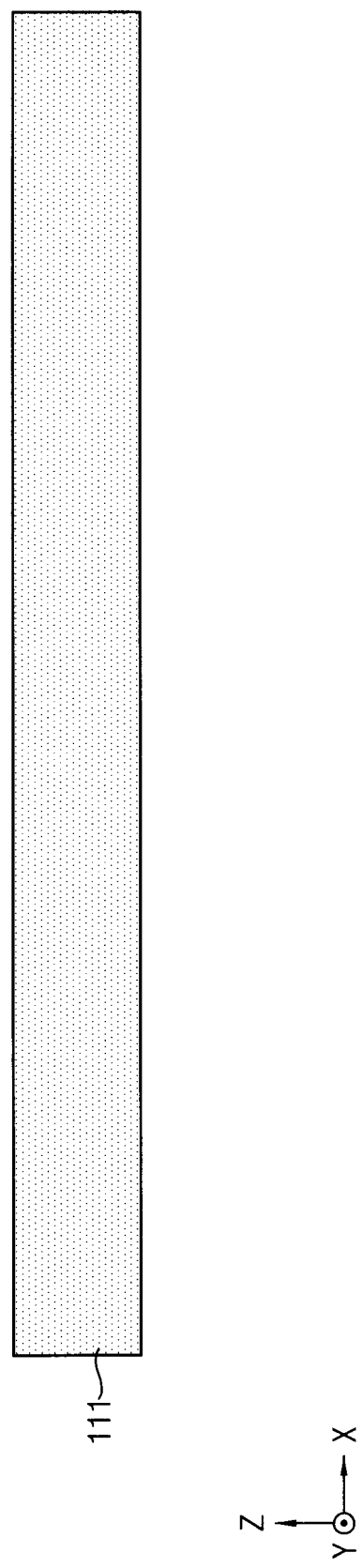

Referring to the exemplary embodiment of FIG. 3A, the core member 111 is provided or prepared. For example, in an exemplary embodiment, the core member 111 may include a PCB substrate.

Figure 3B:
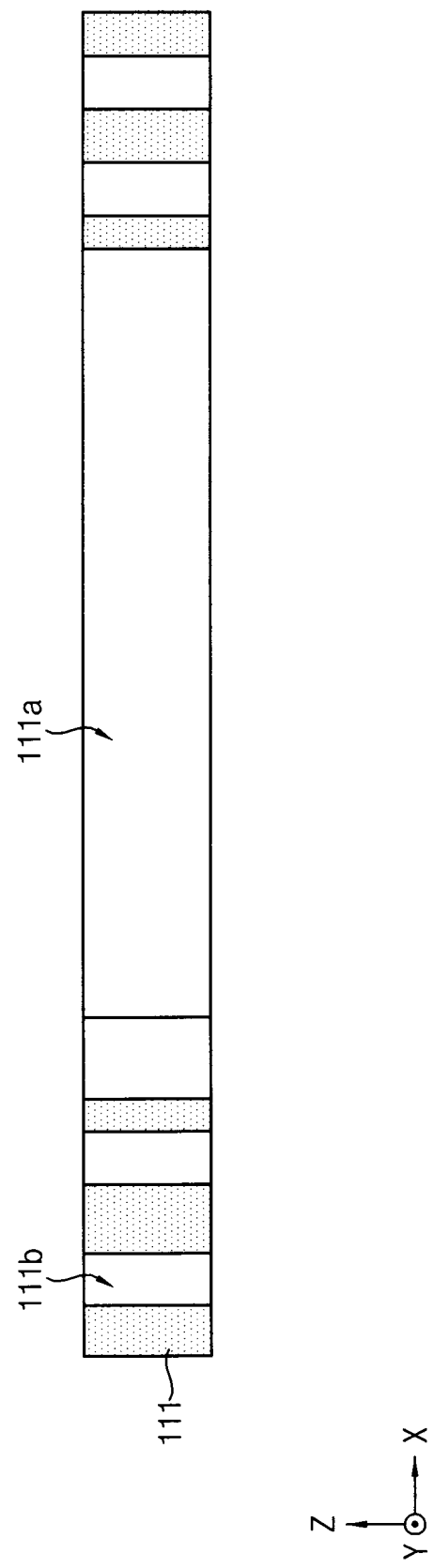

Referring to the exemplary embodiment of FIG. 3B, the through-hole 111a and via-holes 111b penetrating the core member 111 (e.g., in the Z direction) are formed. In an exemplary embodiment, the through-hole 111a and the via-holes 111b may be formed using a mechanical drill, a laser drill, or the like. However, exemplary embodiments of the present inventive concepts are not limited thereto.

Figure 3C:
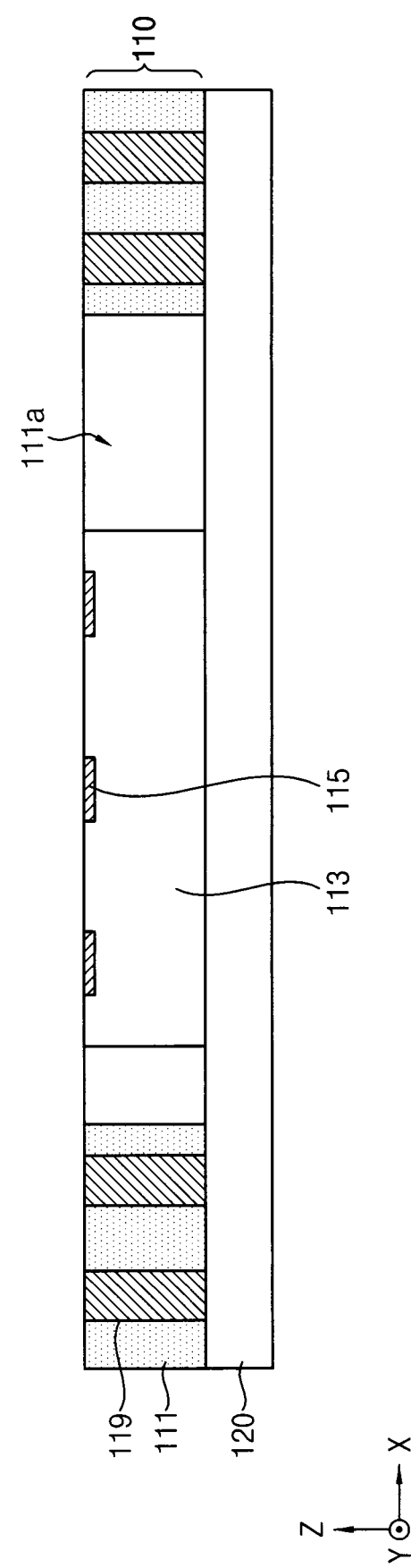

Referring to the exemplary embodiment of FIG. 3C, the core vias 119 are formed in the via-holes 111b of the core member 111, and the first semiconductor chip 113 is disposed in the through-hole 111a of the core member 111. The core vias 119 may electrically connect the first redistribution layer 130 with the second redistribution layer 150. For example, the first redistribution layer 130 and the second redistribution layer 150 may be electrically connected to each other by the core vias 119. In an exemplary embodiment, the core vias 119 may be formed by a plating process. For example, the plating process may be a subtractive process, an additive process, a semi-additive process (SAP), a modified semi-additive process (MSAP), or the like. However, exemplary embodiments of the present inventive concepts are not limited thereto. For example, as shown in the exemplary embodiment of FIG. 3C, a carrier 120 may be attached to a lower portion of the core member 111, and then the first semiconductor chip 113 may be disposed in the face-up form on the carrier 120 exposed through the through-hole 111a. In an exemplary embodiment, an adhesive film for attaching the first semiconductor chip 113 may be interposed between the core member 111 and the carrier 120. For example, the adhesive film may contact a lower surface of the core member 111 and an upper surface of the carrier 120.

In an exemplary embodiment, materials of the core vias 119 may be a conductive material such as copper (Cu), aluminum (Al), silver (Ag), tin (Sn), gold (Au), nickel (Ni), lead (Pb), titanium (Ti), and/or alloys thereof. For example, each of the core vias 119 may be entirely filled with the conductive material, or the conductive material may be formed along a wall of respective one of the via-holes 111b. In addition, each of the core vias 119 may have any known shape such as an hourglass shape, a cylindrical shape, and the like.

In an exemplary embodiment, the core via 119 may be formed first, and then the carrier 120 may be attached and the first semiconductor chip 113 may be disposed in the through hole 111a. However, exemplary embodiments of the present inventive concepts are not limited thereto.

Figure 3D:
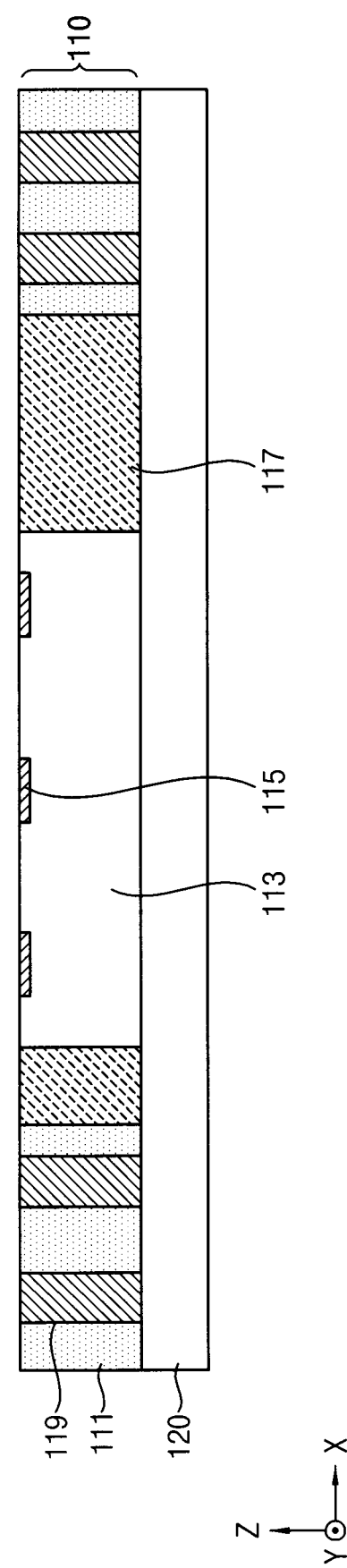

Referring to the exemplary embodiment of FIG. 3D, the encapsulant 117 for encapsulating the first semiconductor chip 113 is formed in the through-hole 111a of the core member 111. Therefore, the core layer 110 of the first package 100 is formed.

The encapsulant 117 may encapsulate or protect the first semiconductor chip 113, and may provide an insulating region. An encapsulation form of the encapsulant 117 is not particularly limited, but may be a form in which the encapsulant 117 surrounds at least portions of the first semiconductor chip 113. For example, the encapsulant 117 may cover lateral side surfaces (e.g., in the X direction) of the first semiconductor chip 113, and may further cover lower surfaces of the first semiconductor chip 113. In addition, the encapsulant 117 may fill a space in the through-hole 111a of the core member 111. However, exemplary embodiments of the present inventive concepts are not limited thereto. A material of the encapsulant 117 is not particularly limited, but may be, for example, a photoimagable encapsulant (PIE). Alternatively, an insulating material such as ABF, or the like, may be used, if necessary.

Figure 3E:
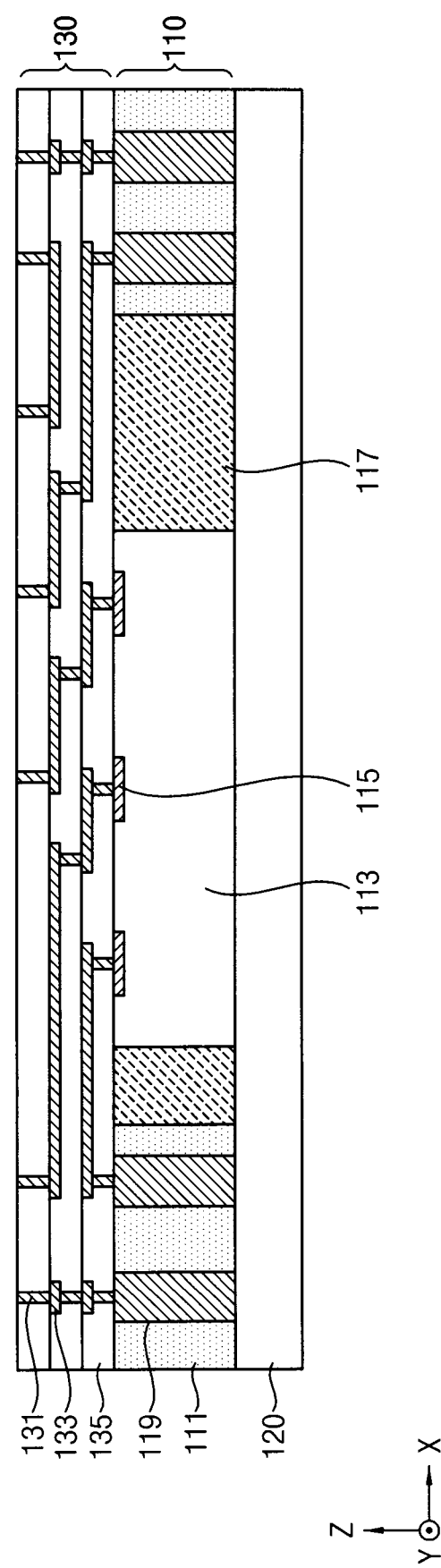

Referring to the exemplary embodiment of FIG. 3E, the first redistribution layer 130 is formed on the core member 111 (e.g., on the core layer 110). For example, a lower surface of the first redistribution layer 130 may directly contact an upper surface of the core member 111.

For example, the lowermost insulating layer among the plurality of insulating layers 135 may be formed by a lamination process or any known applying process. Via-holes may then be formed in the lowermost insulating layer by a photolithography process. In an exemplary embodiment, some of the vias 131 and some of the wirings 133 in or on the lowermost insulating layer may then be formed by the plating process described above. In a similar manner, the remaining insulating layers 135, vias 131 and wirings 133 may then be sequentially formed.

In an exemplary embodiment, the plurality of insulating layers 135 may include an insulating material. For example, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric). For example, the insulating material may be prepreg, Ajinomoto Build up Film (ABF), FR-4, Bismaleimide Triazine (BT), and/or the like. However, exemplary embodiments of the present inventive concepts are not limited thereto.

In an exemplary embodiment, at least portions of the plurality of insulating layers 135 may include a photosensitive insulating material such as a photoimagable dielectric (PID) resin. For example, at least portions of the plurality of insulating layers 135 may be a photosensitive insulating layer. In exemplary embodiments in which the insulating layer 135 has photosensitive properties, the insulating layer 135 may be formed to have a lower thickness, and a fine pitch of the vias 131 may be achieved more easily. In an exemplary embodiment, the insulating layer 135 may be a photosensitive insulating layer including an insulating resin and an inorganic filler. In exemplary embodiments in which the insulating layers 135 are multiple layers, materials of the insulating layers 135 may be the same as each other or may also be different from each other. When the insulating layers 135 are the multiple layers, the insulating layers 135 may be integrated with each other depending on a process, such that a boundary therebetween may also not be apparent.

In an exemplary embodiment, the uppermost insulating layer among the plurality of insulating layers 135 may be a passivation layer. The passivation layer may protect the first package 100 from external physical and/or chemical damages. In an exemplary embodiment, the passivation layer may include an insulating resin and an inorganic filler, but may not include a glass fiber. For example, the passivation layer may be formed of an ABF. However, exemplary embodiments of the passivation layer are not limited thereto. For example, the passivation layer may also be formed of a PID, a solder resist, and/or the like. In an exemplary embodiment, the passivation layer may be formed by any known lamination process, hardening process, or the like.

In an exemplary embodiment, the plurality of vias 131 and the plurality of wirings 133 may include a conductive material such as copper (Cu), aluminum (Al), silver (Ag), tin (Sn), gold (Au), nickel (Ni), lead (Pb), titanium (Ti), and/or alloys thereof.

Figure 3F:
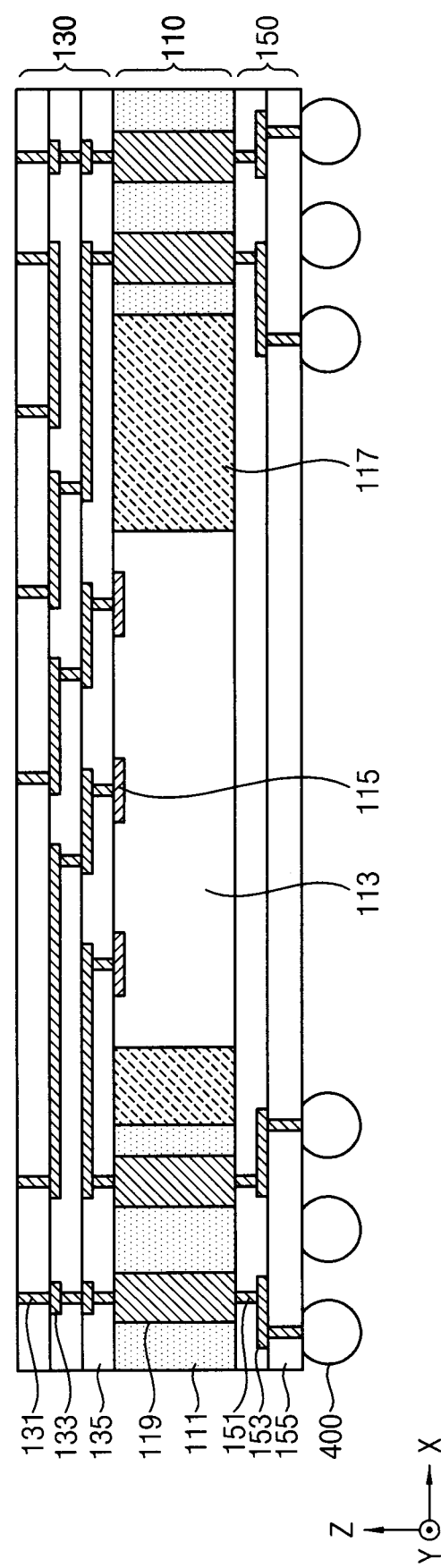

Referring to the exemplary embodiment of FIG. 3F, the second redistribution layer 150 is formed under the core member 111 (e.g., on the core layer 110), and the plurality of second electrical connection structures 400 are formed under the second redistribution layer 150 (e.g., in the Z direction).

In an exemplary embodiment, the carrier 120 may be removed, and the uppermost insulating layer among the plurality of insulating layers 155 of the second redistribution layer 150 may be formed by a lamination process or any known applying process. Via-holes may then be formed in the uppermost insulating layer by a photolithography process. In an exemplary embodiment, some of the vias 151 and some of the wirings 153 in or on the uppermost insulating layer may then be formed by the plating process described above. In a similar manner, the remaining insulating layers 155, vias 151 and wirings 153 may be sequentially formed. The plurality of second electrical connection structures 400 may then be formed by a reflow process, or the like.

In an exemplary embodiment, materials included in the plurality of vias 151 and the plurality of wirings 153 of the second redistribution layer 150 may be substantially the same as the materials included in the plurality of vias 131 and the plurality of wirings 133 of the first redistribution layer 130. In an exemplary embodiment, materials included in the plurality of insulating layers 155 of the second redistribution layer 150 may be substantially the same as the materials included in the plurality of insulating layers 135 of the first redistribution layer 130.

In an exemplary embodiment, the lowermost insulating layer among the plurality of insulating layers 155 may be a passivation layer that protects the first package 100 from external physical and/or chemical damages.

In an exemplary embodiment, the plurality of second electrical connection structures 400 may be formed of a conductive material, such as a solder, or the like. However, exemplary embodiments of the present inventive concepts are not limited thereto and materials of each of the second electrical connection structures 400 may vary. In an exemplary embodiment, the second electrical connection structures 400 may be a land, a ball, a pin, and/or the like. The second electrical connection structures 400 may be formed as a multilayer or single layer structure. In an exemplary embodiment in which the second electrical connection structures 400 are formed as a multilayer structure, the second electrical connection structures 400 may include a copper (Cu) pillar and a solder. In an exemplary embodiment in which the second electrical connection structures 400 are formed as a single layer structure, the second electrical connection structures 400 may include a tin-silver solder, copper (Cu), and/or the like. However, this is only an example, and the second electrical connection structures 400 are not limited thereto. For example, the number, an interval, a disposition form, and the like, of the second electrical connection structures 400 are not particularly limited, but may be sufficiently modified depending on design particulars by those skilled in the art.

Figure 3G:
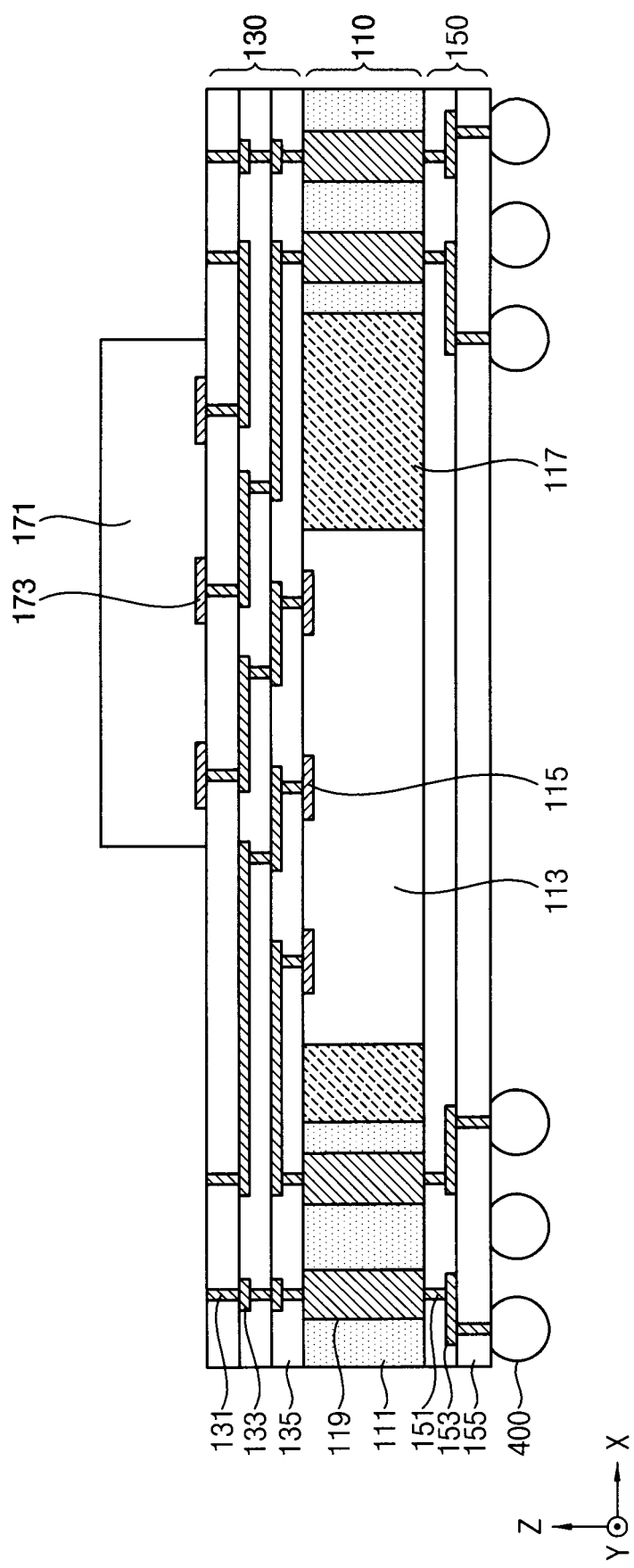

Referring to the exemplary embodiment of FIG. 3G, the second semiconductor chip 171 is disposed on the first redistribution layer 130. For example, a lower surface of the second semiconductor chip 171 may directly contact an upper surface of the first redistribution layer. As shown in the exemplary embodiment of FIG. 3G, the second semiconductor chip 171 may be disposed in the face-down form on the first redistribution layer 130.

Figure 3H:
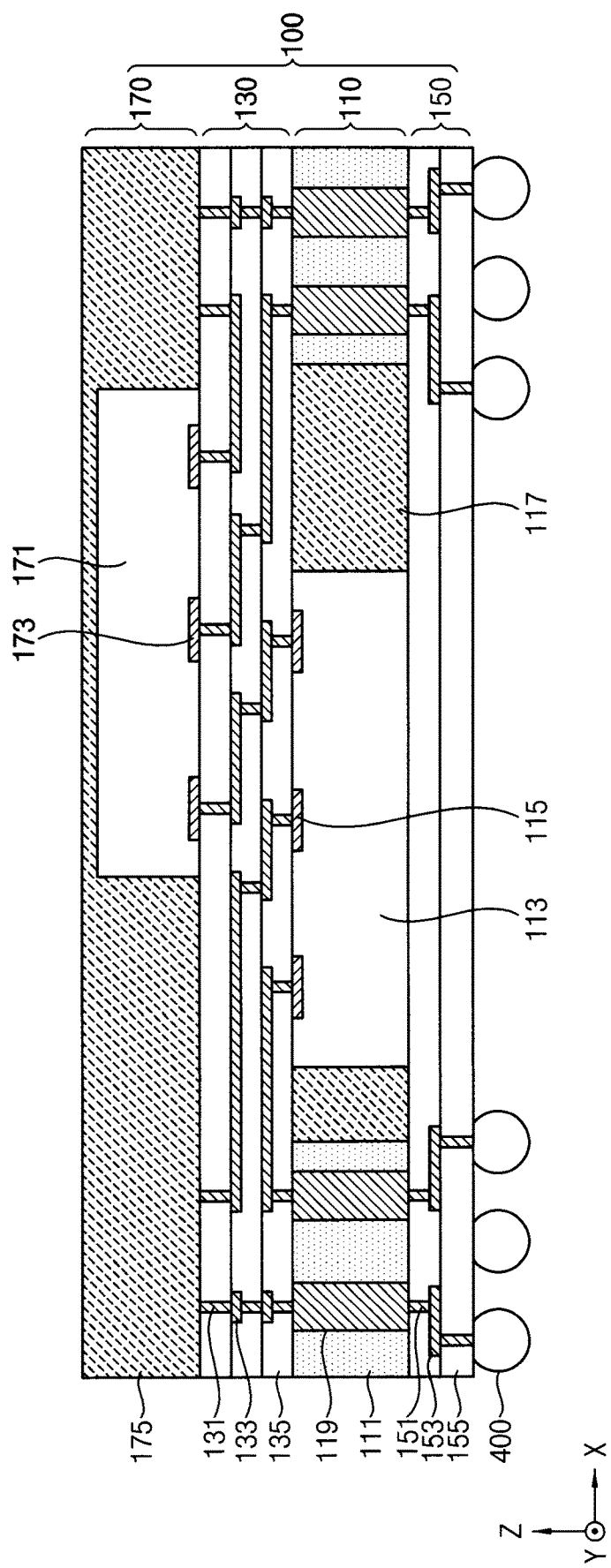

Referring to the exemplary embodiment of FIG. 3H, the encapsulant 175 for encapsulating the second semiconductor chip 171 is formed on the first redistribution layer 130, and thus the first layer 170 of the first package 100 is formed. As a result, a manufacturing process of the first package 100 is completed.

In an exemplary embodiment, a material included in the encapsulant 175 encapsulating the second semiconductor chip 171 may be substantially the same as the material included in the encapsulant 117 encapsulating the first semiconductor chip 113.

In an exemplary embodiment, the encapsulant 175 may be a passivation layer that protects the first package 100 from external physical and/or chemical damages.

In an exemplary embodiment, the plurality of second electrical connection structures 400 may be formed first, and then the first layer 170 may be formed. However, exemplary embodiments of the present inventive concepts are not limited thereto. For example, in another exemplary embodiment, the plurality of second electrical connection structures 400 may be formed in a later process.

Although the exemplary embodiments of FIGS. 3A, 3B, 3C, 3D, 3E, 3F, 3G and 3H illustrate a process of manufacturing one first package 100, exemplary embodiments of the present inventive concepts are not limited thereto.

Referring to the exemplary embodiment of FIG. 4, to facilitate the mass production, a core member 111t (e.g., a PCB substrate) having a relatively large size may be provided, and a plurality of through-holes 111a may be formed in the core member 111t. A plurality of via-holes are omitted in FIG. 4 for convenience of illustration. A package group including a plurality of first packages integrated in the substrate may be manufactured at one time by a series of processes described with reference to the exemplary embodiments of FIGS. 3C, 3D, 3E, 3F, 3G and 3H, and the plurality of first packages may be singulated into individual first package by a sawing process. In this exemplary embodiment, the productivity may be increased because the packages are manufactured based on a square PCB substrate rather than a circular wafer and thus the loss portion of the substrate is relatively reduced.

Referring to the exemplary embodiment of FIG. 5A, the third semiconductor chip 230 is disposed on the substrate 210. For example, a lower surface of the third semiconductor chip 230 may directly contact an upper surface of the substrate 210. In an exemplary embodiment, the substrate 210 may include a PCB substrate. For example, the third semiconductor chip 230 may be disposed in the face-up form or face-down form on the substrate 210.

Referring to the exemplary embodiment of FIG. 5B, the encapsulant 250 for encapsulating the third semiconductor chip 230 is formed on the substrate 210. In an exemplary embodiment, a material included in the encapsulant 250 encapsulating the third semiconductor chip 230 may be substantially the same as the material included in the encapsulants 117 and 175 encapsulating the first and second semiconductor chips 113, 171, respectively. In an exemplary embodiment, the encapsulant 250 may be a passivation layer that protects the second package 200 from external physical and/or chemical damages.

Referring to the exemplary embodiment of FIG. 5C, the plurality of first electrical connection structures 300 are formed under the substrate 210 (e.g., in the Z direction). As a result, a manufacturing process of the second package 200 is completed. In an exemplary embodiment, materials included in the first electrical connection structures 300 may be substantially the same as the materials included in the second electrical connection structures 400.

Referring to the exemplary embodiment of FIG. 6, holes 175a for electrical connection with the second package 200 are formed in the encapsulant 175 of the first package 100. For example, the holes 175a may be formed in the encapsulant 175 by a laser drill process (LDP) using a laser drill. However, exemplary embodiments of the present inventive concepts are not limited thereto. Portions of the first redistribution layer 130 may be exposed by the holes 175a.

As illustrated in the exemplary embodiment of FIG. 1, the second package 200 is disposed on the first package 100 (e.g., in the Z direction) and the first package 100 and the second package 200 are electrically connected to each other using the plurality of first electrical connection structures 300 formed in the holes 175a. As a result, a manufacturing process of the semiconductor package 10 is completed.

FIGS. 7A, 7B, 7C and 7D are cross-sectional views of a second package included in a semiconductor package according to exemplary embodiments of the present inventive concepts.

Figure 7A:
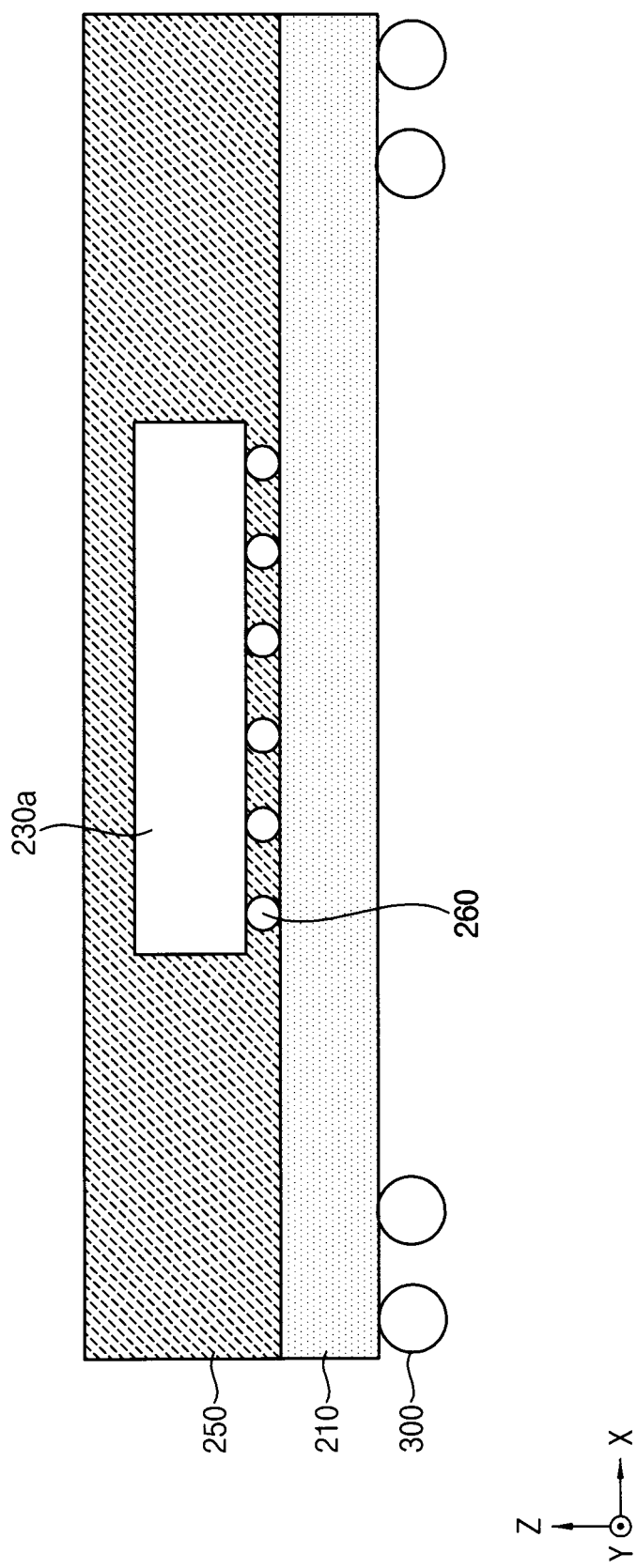

Referring to the exemplary embodiment of FIG. 7A, a third semiconductor chip 230a included in the second package may be implemented in the form of a flip chip. For example, the third semiconductor chip 230a may be disposed in the face-down form such that a surface on which pads are formed faces downwards (e.g., towards the substrate 210 in the Z direction), and electrical connection structures 260 may be formed between the third semiconductor chip 230a and the substrate 210.

Referring to the exemplary embodiment of FIG. 7B, a third semiconductor chip 230b included in the second package may be implemented in the form of a non-flip chip or an epi-up chip. For example, the third semiconductor chip 230b may be disposed in the face-up form such that a surface on which pads are formed faces upwards (e.g., away from the substrate 210 in the Z direction), and the third semiconductor chip 230b and the substrate 210 may be electrically connected to each other through at least one bonding wire 270. For example, the exemplary embodiment of FIG. 7B includes two bonding wires 270. However, exemplary embodiments of the present inventive concepts are not limited thereto.

Figure 7C:
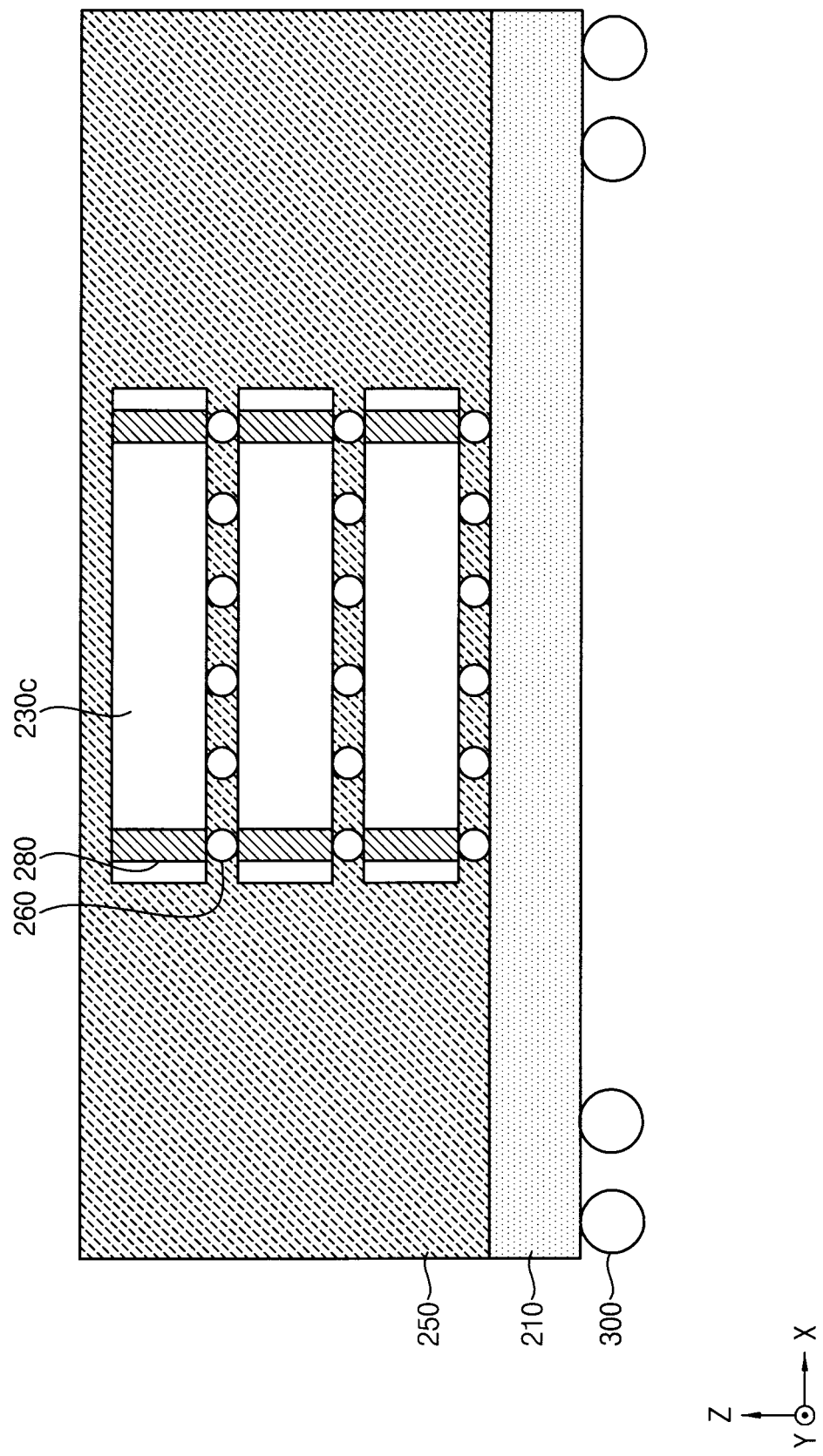

Referring to the exemplary embodiment of FIG. 7C, similar to the exemplary embodiment of FIG. 7A, the third semiconductor chip 230c included in the second package may be implemented in the form of a flip chip. In addition, as shown in the exemplary embodiment of FIG. 7C, the second package may be implemented in a multi-stack structure in which a plurality of third semiconductor chips 230c are stacked in a vertical direction. For example, the exemplary embodiment of FIG. 7C includes a multi-stack structure including three flip chips. However, exemplary embodiments of the present inventive concepts are not limited thereto and the number of flip chips in the multi-stack structure may vary. Each of the third semiconductor chips 230c may be similar to the third semiconductor chip 230a in the exemplary embodiment of FIG. 7A. The second package 200 may further include through silicon vias (TSVs) 280 for electrical connection between the third semiconductor chips 230c.

Referring to the exemplary embodiment of FIG. 7D, similar to the exemplary embodiment of FIG. 7B, a third semiconductor chip 230d included in the second package may be implemented in the form of a non-flip chip. In addition, as shown in the exemplary embodiment of FIG. 7D, similar to the exemplary embodiment of FIG. 7C, the second package may be implemented in a multi-stack structure in which a plurality of third semiconductor chips 230d are stacked in a vertical direction. As illustrated in FIG. 7D, the plurality of third semiconductor chips 230d may be stacked scalariformly, such as in a step shape, such that pads of each semiconductor chip may be exposed (e.g., the pads may be exposed on a lateral edge of each step). In this stacked state, the plurality of third semiconductor chips 230d may be electrically connected to one another and the substrate 210 through at least one bonding wire 270.

Figure 8:
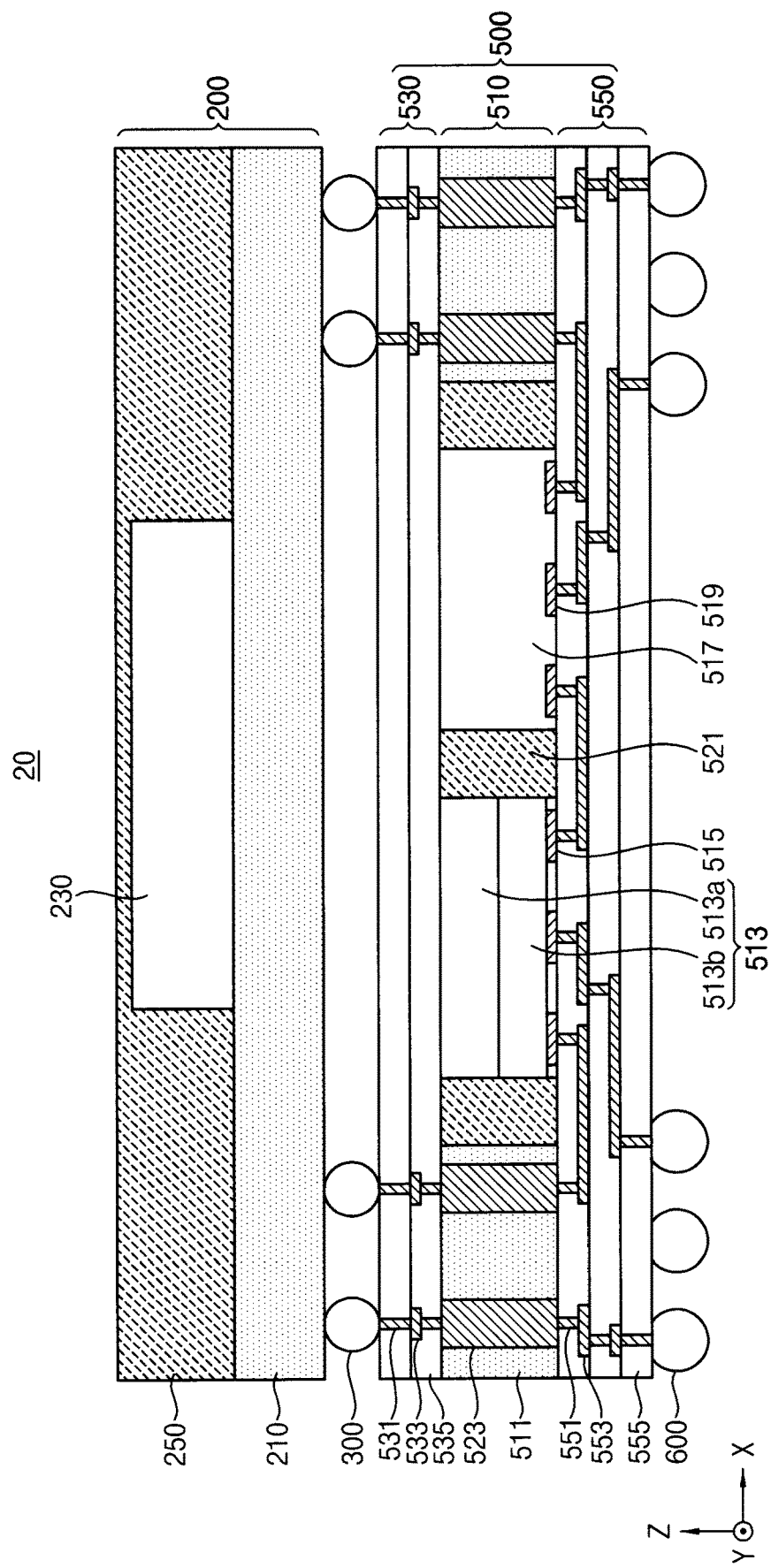
FIG. 8 is a cross-sectional view of a semiconductor package according to an exemplary embodiment of the present inventive concepts.

FIG. 8 is a cross-sectional view of a semiconductor package according to an exemplary embodiment of the present inventive concepts. The description of elements substantially similar or identical to the elements included in the exemplary embodiment of FIG. 1 will be omitted for convenience of explanation.

Referring to the exemplary embodiment of FIG. 8, a semiconductor package 20 includes a first package 500 that includes a first semiconductor chip 513 and a second semiconductor chip 517, a second package 200 that includes a third semiconductor chip 230 and is disposed on the first package 500, a plurality of first electrical connection structures 300 disposed between the first and second packages 200, 500, and a plurality of second electrical connection structures 600.

The semiconductor package 20 of the exemplary embodiment of FIG. 8 may be substantially the same as the semiconductor package 10 of the exemplary embodiment of FIG. 1, except that a structure of the first package 500 is changed.

The first package 500 includes a core layer 510, a first redistribution layer 530 and a second redistribution layer 550.

The core layer 510 includes a core member 511, the first semiconductor chip 513, the second semiconductor chip 517, an encapsulant 521 and core vias 523.

The core member 511 may be substantially the same as the core member 111 in the exemplary embodiment of FIG. 1. The core member 511 includes a through-hole (e.g., a through-hole 511a in FIG. 9B). In the exemplary embodiment of FIG. 8, both of the first and second semiconductor chips 513 and 517 may be disposed inside the through-hole 511a of the core member 511.

The first and second semiconductor chips 513 and 517 may be substantially the same as the first and second semiconductor chips 113 and 171 in the exemplary embodiment of FIG. 1, respectively. However, the first and second semiconductor chips 513 and 517 are both disposed in the through-hole 511a of the core member 511. For example, the first and second semiconductor chips 513 and 517 may be disposed adjacent to each other in a horizontal direction (e.g., in the X direction) in the through-hole 511a. For example, the first and second semiconductor chips 513 and 517 may have a side-by-side structure in contrast to the exemplary embodiment of FIG. 1 in which the first and second semiconductor chips 513, 517 are spaced apart in the Z direction. The first semiconductor chip 513 may include a first active surface having first pads 515 disposed thereon and a first inactive surface opposite to the first active surface. The second semiconductor chip 517 may include a second active surface having second pads 519 disposed thereon and a second inactive surface opposite to the second active surface. As shown in the exemplary embodiment of FIG. 8, the first and second active surfaces may be on a lower surface (e.g., in the Z direction) of the first and second semiconductor chips 513, 517, respectively. The first and second inactive surfaces may be on an upper surface (e.g., in the Z direction) of the first and second semiconductor chips 513, 517, respectively.

In an exemplary embodiment, the first semiconductor chip 513 may be disposed in face-down form such that the first inactive surface is directed toward the second package 200 (e.g., in the Z direction), and the second semiconductor chip 517 may also be disposed in face-down form such that the second inactive surface is directed toward the second package 200 (e.g., in the Z direction). However, exemplary embodiments of the present inventive concepts are not limited thereto. For example, in another exemplary embodiment, at least one of the first and second semiconductor chips 513 and 517 may be disposed in face-up form.

In an exemplary embodiment, at least one of the first and second semiconductor chips 513 and 517 may be a three-dimensional (3D) integration semiconductor chip. For example, in the exemplary embodiment of FIG. 8, the first semiconductor chip 513 may be the 3D integration semiconductor chip. For example, the first semiconductor chip 513 may be implemented by stacking first and second semiconductor devices 513a and 513b performing different functions in the Z direction (e.g., a vertical direction). A multi-function 3D integration semiconductor chip may be efficiently implemented by a wafer-to-wafer bonding technology.

In an exemplary embodiment, the first semiconductor device 513a of the first semiconductor chip 513 may include an active element, and the second semiconductor device 513b of the first semiconductor chip 513 may include a passive element. For example, the first semiconductor device 513a may include an AP or a PMIC, and the second semiconductor device 513b may include a capacitor. However, exemplary embodiments of the present inventive concepts are not limited thereto, and the types and number of the first and second semiconductor devices 513a and 513b may be changed in other exemplary embodiments.

The encapsulant 521 may be substantially the same as the encapsulant 117 encapsulating the first semiconductor chip 113 in the exemplary embodiment of FIG. 1. As shown in the exemplary embodiment of FIG. 8, the encapsulant 521 may encapsulate the both of the first and second semiconductor chips 513 and 517. The core vias 523 extending through the core member 511 (e.g., in the Z direction) may be substantially the same as the core vias 119 in the exemplary embodiment of FIG. 1.

The first redistribution layer 530 may be substantially the same as the first redistribution layer 130 in the exemplary embodiment of FIG. 1. The first redistribution layer 530 may include a plurality of vias 531, a plurality of wirings 533 and a plurality of insulating layers 535. However, while the vias 131 of the first redistribution layer 130 directly contact the first pads 115 of the first semiconductor chip 113, the second pads 173 of the second semiconductor chip 171 and the core vias 119 in the exemplary embodiment of FIG. 1, the vias 531 in the exemplary embodiment of FIG. 8 directly contact the core vias 523 but do not directly contact the first pads 515 or second pads 519 of the first and semiconductor chips 513, 517, respectively. The second redistribution layer 550 may be substantially the same as the second redistribution layer 150 in the exemplary embodiment of FIG. 1. However, while the vias 151 of the second redistribution layer 150 only directly contact the core vias 119 in the exemplary embodiment of FIG. 1, the vias 551 of the second redistribution layer 550 in the exemplary embodiment of FIG. 8 directly contact the core vias 523 and the first pads 515 and second pads 519 of the first and semiconductor chips 513, 517, respectively. The second redistribution layer 550 may include a plurality of vias 551, a plurality of wirings 553 and a plurality of insulating layers 555. The plurality of second electrical connection structures 600 may be substantially the same as the plurality of second electrical connection structures 400 in the exemplary embodiment of FIG. 1.

The semiconductor package 20 according to an exemplary embodiment may be implemented with a PoP scheme in which the first package 500 implemented as a fan-out scheme is used as a substrate and the second package 200 is disposed on the first package 500 (e.g., in the Z direction). In addition, the first and second semiconductor chips 513 and 517 in the first package 500 may be arranged side by side in the horizontal direction X in the core member 511 (e.g., on the same layer), and the first semiconductor chip 513 may be implemented as the 3D integration semiconductor chip. Accordingly, a multi-function/integration structure may be efficiently implemented within a limited package area.

FIGS. 9A, 9B, 9C, 9D, 9E and 9F are cross-sectional views for describing a method of manufacturing a semiconductor package of the exemplary embodiment of FIG. 8. The description of elements substantially similar or identical to the elements provided for the exemplary embodiments of FIGS. 3A, 3B, 3C, 3D, 3E, 3F, 3G and 3H will be omitted for convenience of explanation.

Figure 9A:
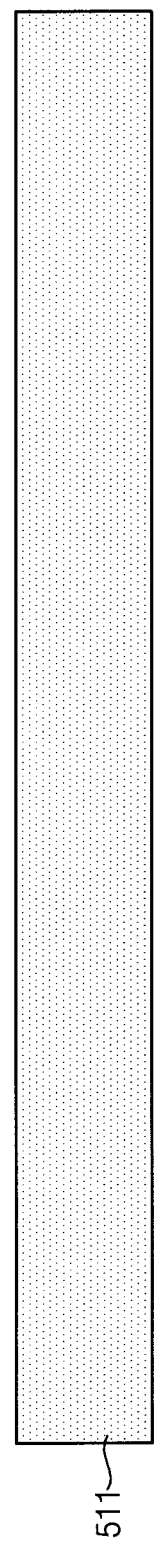
FIGS. 9A, 9B, 9C, 9D, 9E and 9F are cross-sectional views for describing a method of manufacturing a semiconductor package of FIG. 8 according to exemplary embodiments of the present inventive concepts.
Figure 9B:
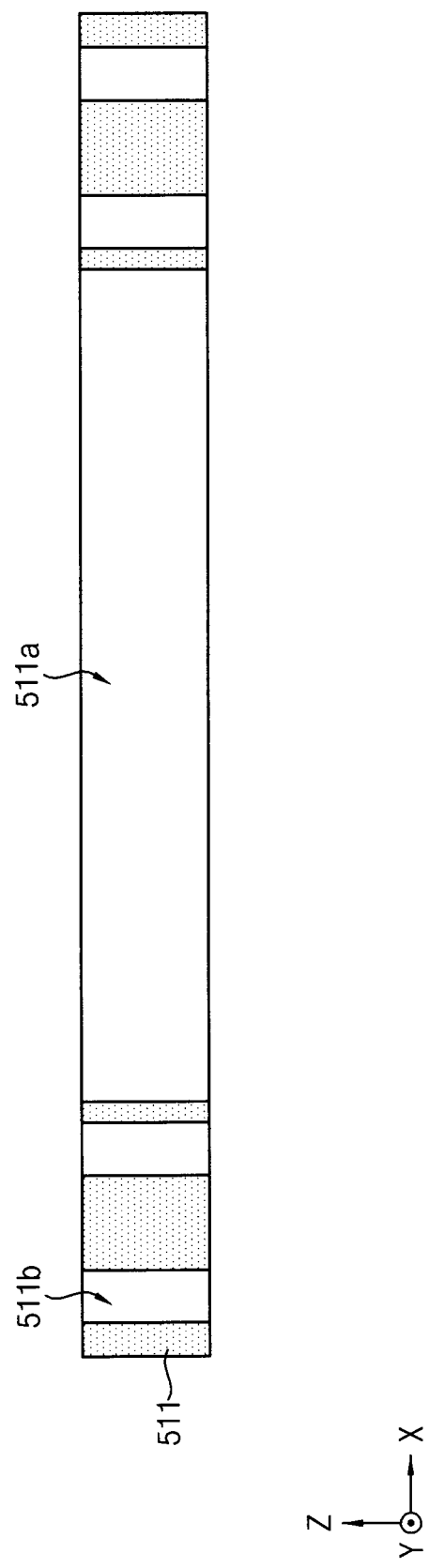

Referring to the exemplary embodiments of FIGS. 9A and 9B, similar to the exemplary embodiments of FIGS. 3A and 3B, the core member 511 is provided, and the through-hole 511a and via-holes 511b penetrating the core member 511 (e.g., in the Z direction) are formed.

Figure 9C:
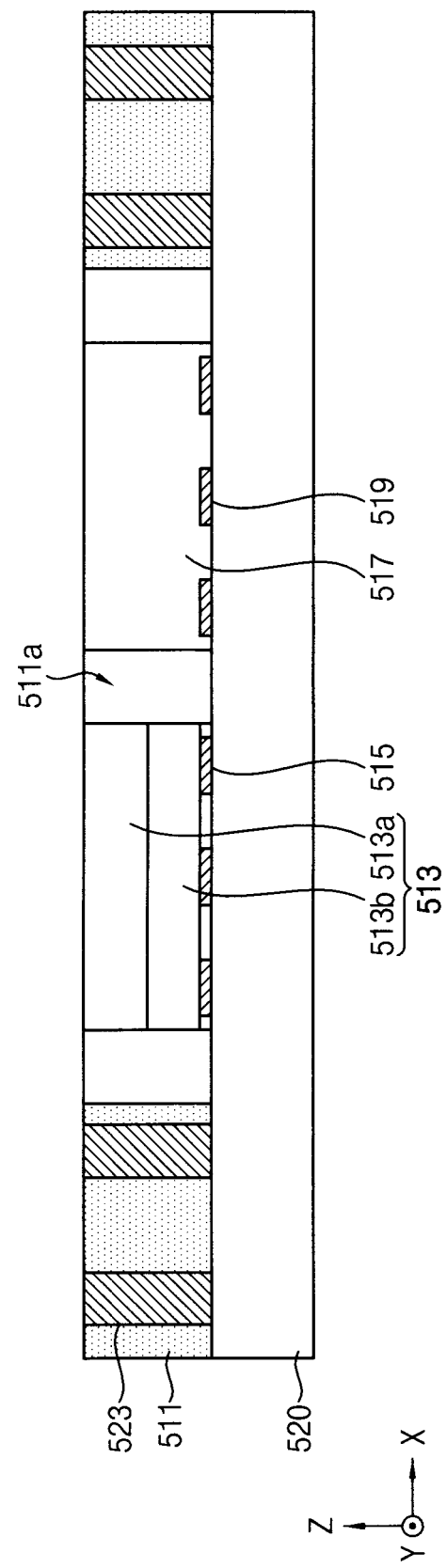

Referring to the exemplary embodiment of FIG. 9C, similar to the exemplary embodiment of FIG. 3C, the core vias 523 are formed in the via-holes 511b of the core member 511, and the first and second semiconductor chips 513 and 517 are disposed in the through-hole 511a of the core member 511. The carrier 520 may be used for disposing the first and second semiconductor chips 513 and 517 in the through-hole 511a. In an exemplary embodiment, the first and second semiconductor chips 513 and 517 may be substantially simultaneously or sequentially disposed.

Figure 9D:
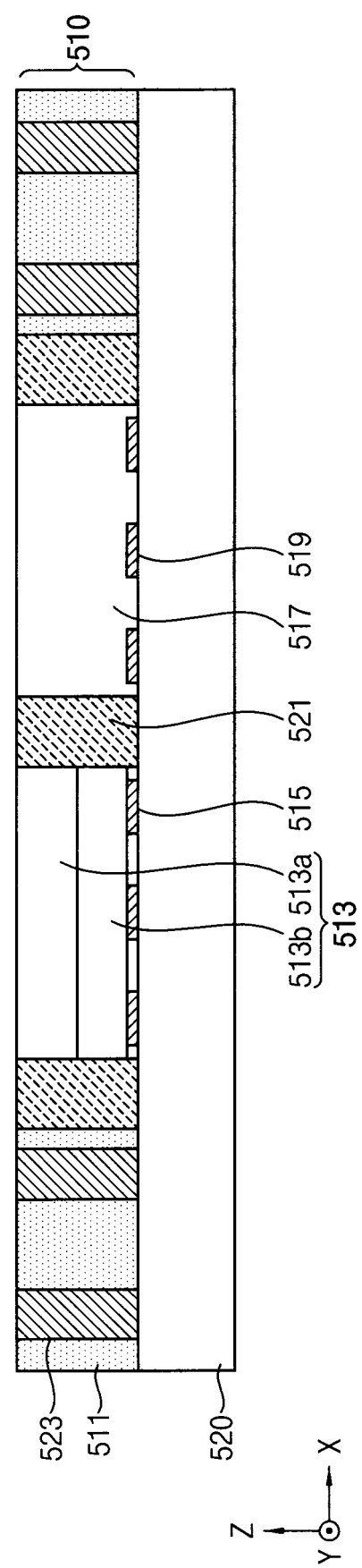

Referring to the exemplary embodiment of FIG. 9D, similar to the exemplary embodiment of FIG. 3D, the encapsulant 521 for encapsulating the first and second semiconductor chips 513 and 517 is formed in the through-hole 511a of the core member 511, and thus the core layer 510 of the first package 500 is formed.

Figure 9E:
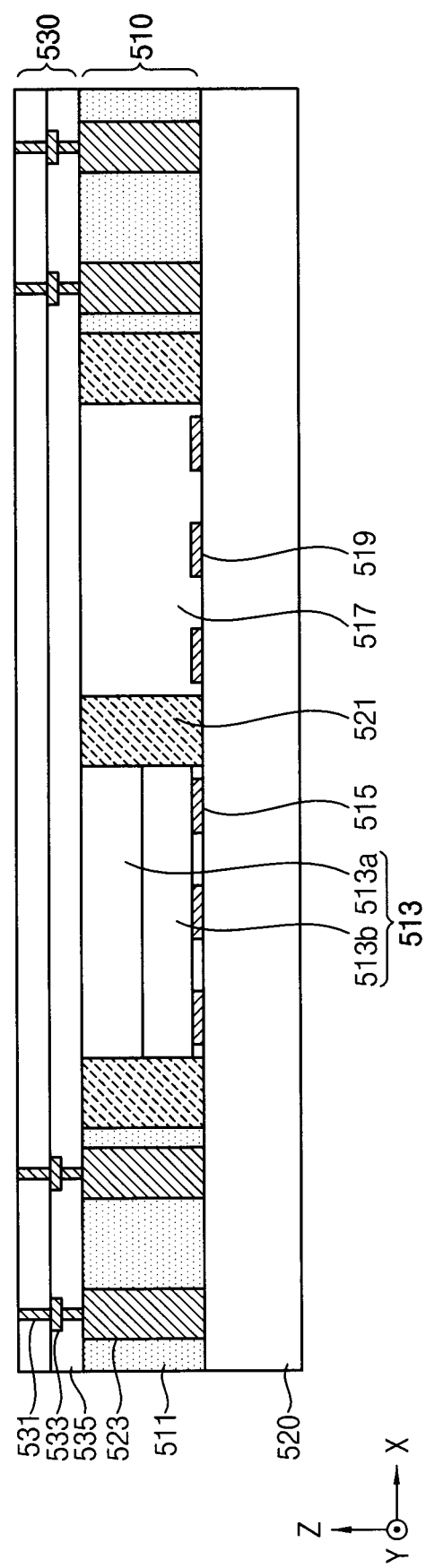
Figure 9F:
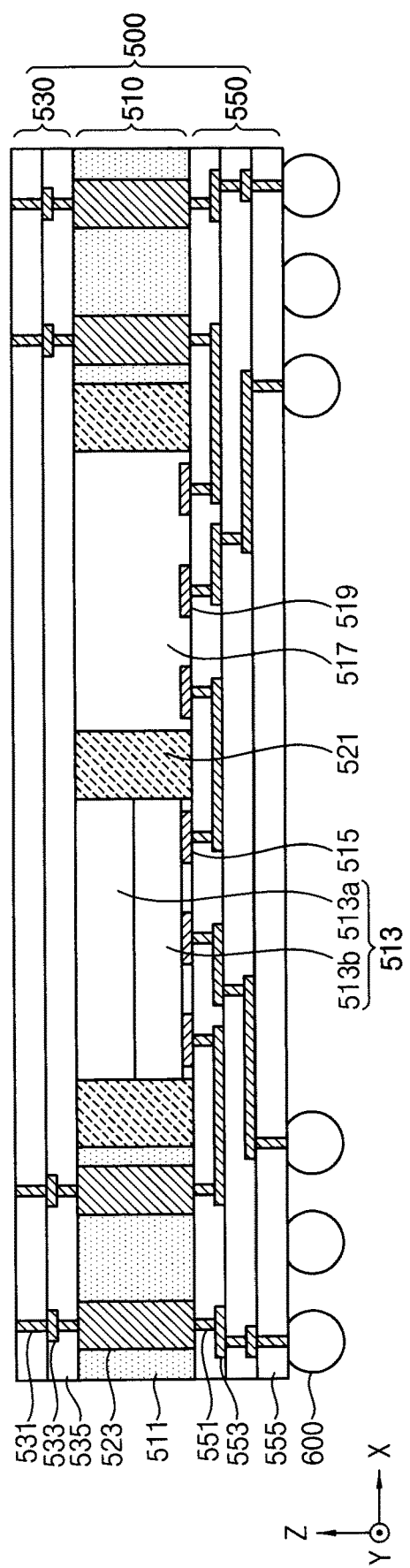

Referring to the exemplary embodiments of FIGS. 9E and 9F, similar to the exemplary embodiments of FIGS. 3E and 3F, the first redistribution layer 530 is formed on the core member 511 (e.g., above the core member 511 in the Z direction). The second redistribution layer 550 is formed under the core member 511, and the plurality of second electrical connection structures 600 are formed under the second redistribution layer 550. As a result, a manufacturing process of the first package 500 is completed.

The second package 200 is manufactured as described with reference to the exemplary embodiments of FIGS. 5A, 5B and 5C. As illustrated in the exemplary embodiment of FIG. 8, the second package 200 is then disposed on the first package 500, and the first package 500 and the second package 200 are electrically connected to each other using the plurality of first electrical connection structures 300. As a result, a manufacturing process of the semiconductor package 20 is completed.

Figure 10:
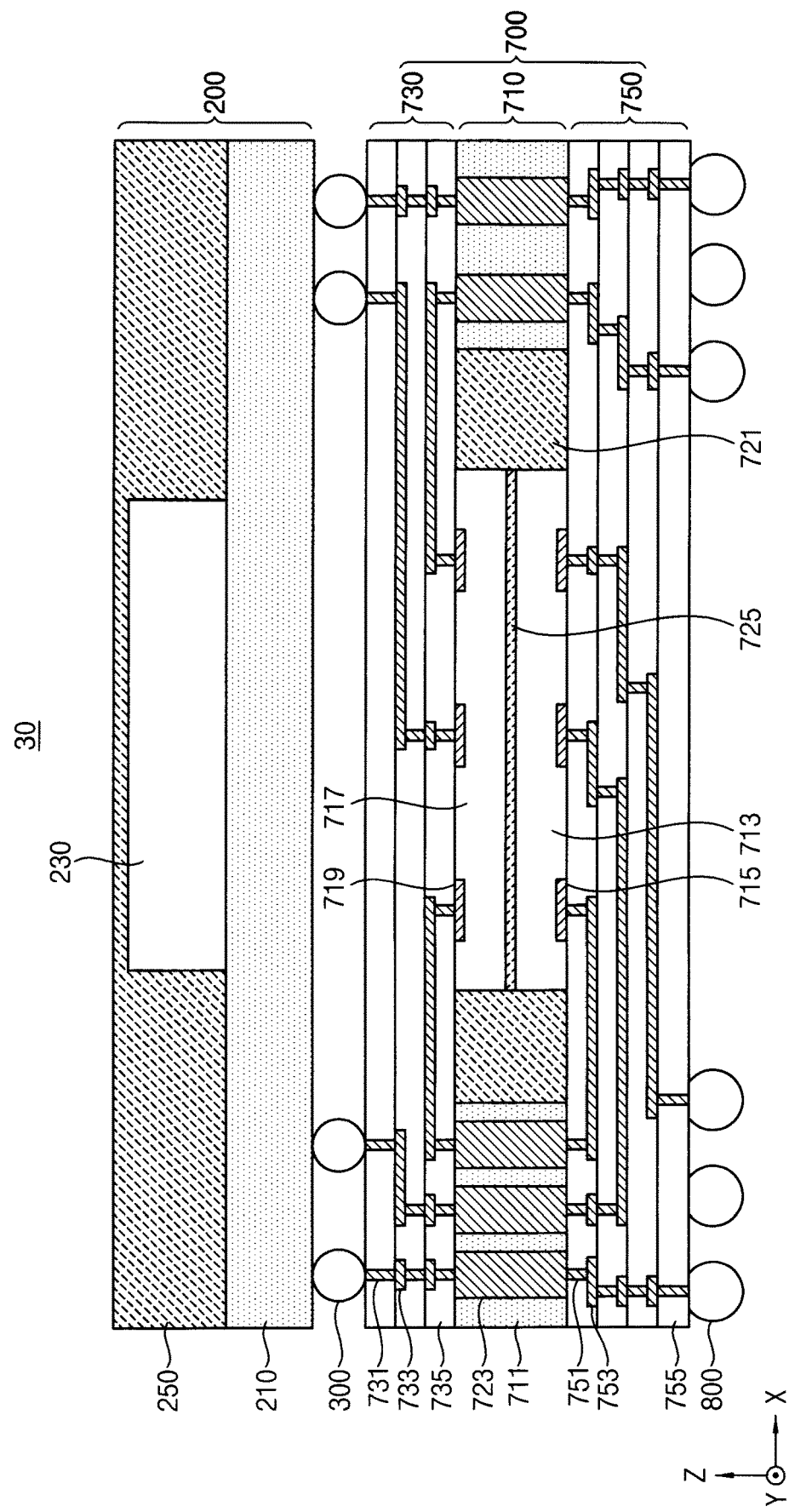
FIG. 10 is a cross-sectional view of a semiconductor package according to an exemplary embodiment of the present inventive concepts.

FIG. 10 is a cross-sectional view of a semiconductor package according to an exemplary embodiment of the present inventive concepts. The description of elements substantially similar or identical to the elements included in the exemplary embodiment of FIG. 1 will be omitted for convenience of explanation.

Referring to the exemplary embodiment of FIG. 10, a semiconductor package 30 includes a first package 700 that includes a first semiconductor chip 713 and a second semiconductor chip 717, a second package 200 that includes a third semiconductor chip 230 and is disposed on the first package 700, a plurality of first electrical connection structures 300, and a plurality of second electrical connection structures 800.

The semiconductor package 30 of the exemplary embodiment of FIG. 10 may be substantially the same as the semiconductor package 10 of the exemplary embodiment of FIG. 1, except that a structure of the first package 700 is changed.

The first package 700 includes a core layer 710, a first redistribution layer 730 and a second redistribution layer 750.

The core layer 710 includes a core member 711, the first semiconductor chip 713, the second semiconductor chip 717, an encapsulant 721 and core vias 723. The core layer 710 may further include an adhesive member 725 disposed between the first semiconductor chip 713 and the second semiconductor chip 717 (e.g., in the Z direction).

The core member 711 may be substantially the same as the core member 111 in the exemplary embodiment of FIG. 1. The core member 711 includes a through-hole (e.g., a through-hole 711a in FIG. 11B). In an exemplary embodiment, both of the first and second semiconductor chips 713 and 717 may be disposed inside the through-hole 711a of the core member 711.

The first and second semiconductor chips 713 and 717 may be substantially the same as the first and second semiconductor chips 113 and 171 in the exemplary embodiment of FIG. 1, respectively. The first and second semiconductor chips 713 and 717 are disposed in the through-hole 711a of the core member 711. For example, the first and second semiconductor chips 713 and 717 may be stacked in the Z direction (e.g., in a vertical direction) in the through-hole 711a. The first semiconductor chip 713 may include a first active surface having first pads 715 disposed thereon and a first inactive surface opposite to the first active surface. The second semiconductor chip 717 may include a second active surface having second pads 719 disposed thereon and a second inactive surface opposite to the second active surface. For example, as shown in the exemplary embodiment of FIG. 10, the first active surface may be on a lower surface of the first semiconductor chip 713 and the second active surface may be on an upper surface of the second semiconductor chip 717. The first inactive surface may be on an upper surface of the first semiconductor chip 713 and the second active surface may be on a lower surface of the second semiconductor chip 717.

The adhesive member 725 may be disposed or interposed between the first and second semiconductor chips 713 and 717 (e.g., in the Z direction). The first and second semiconductor chips 713 and 717 may be affixed to each other by the adhesive member 725. For example, in an exemplary embodiment, the adhesive member 725 may include a die attachment film (DAF). The degree of integration of the semiconductor chip may be increased or improved by a back-to-back bonding technology in which back sides (e.g., first and second inactive surfaces where pads are not disposed) of the wafers are attached to each other.

In an exemplary embodiment, the first semiconductor chip 713 may be disposed in face-down form such that the first inactive surface is directed toward the second package 200, and the second semiconductor chip 717 may be disposed in face-up form such that the second active surface is directed toward the second package 200.

The encapsulant 721 may be substantially the same as the encapsulant 117 encapsulating the first semiconductor chip 113 in the exemplary embodiment of FIG. 1. The encapsulant 721 may encapsulate both of the first and second semiconductor chips 713 and 717. The core vias 723 may be substantially the same as the core vias 119 extending through the core member 111 in the exemplary embodiment of FIG. 1.

The first redistribution layer 730 may be substantially the same as the first redistribution layer 130 in the exemplary embodiment of FIG. 1. The first redistribution layer 730 may include a plurality of vias 731, a plurality of wirings 733 and a plurality of insulating layers 735. The second redistribution layer 750 may be substantially the same as the second redistribution layer 150 in the exemplary embodiment of FIG. 1. The second redistribution layer 750 may include a plurality of vias 751, a plurality of wirings 753 and a plurality of insulating layers 755. The plurality of second electrical connection structures 800 may be substantially the same as the plurality of second electrical connection structures 400 in the exemplary embodiment of FIG. 1.

The semiconductor package 30 according to an exemplary embodiment may be implemented with a PoP scheme in which the first package 700 implemented as a fan-out scheme is used as a substrate and the second package 200 is disposed on the first package 700 (e.g., in the Z direction). In addition, the first and second semiconductor chips 713 and 717 in the first package 700 may be stacked and disposed in the vertical direction Z in the core member 711 (e.g., on the same layer). Accordingly, a multi-function/integration structure may be efficiently implemented within a limited package area.

FIGS. 11A, 11B, 11C, 11D, 11E and 11F are cross-sectional views for describing a method of manufacturing a semiconductor package of FIG. 10 according to exemplary embodiments of the present inventive concepts. The description of elements substantially similar or identical to the elements included in the exemplary embodiments of FIGS. 3A, 3B, 3C, 3D, 3E, 3F, 3G and 3H will be omitted for convenience of explanation.

Figure 11B:
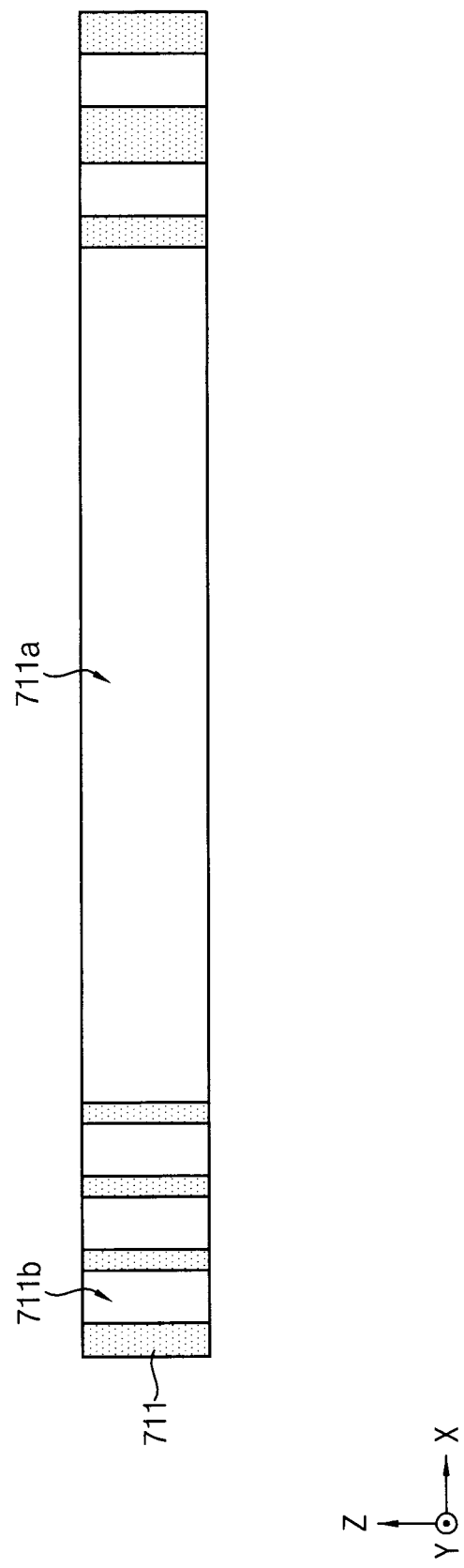

Referring to the exemplary embodiments of FIGS. 11A and 11B, similar to the exemplary embodiments of FIGS. 3A and 3B, the core member 711 is provided, and the through-hole 711a and via-holes 711b penetrating the core member 711 (e.g., in the Z direction) are formed.

Figure 11C:
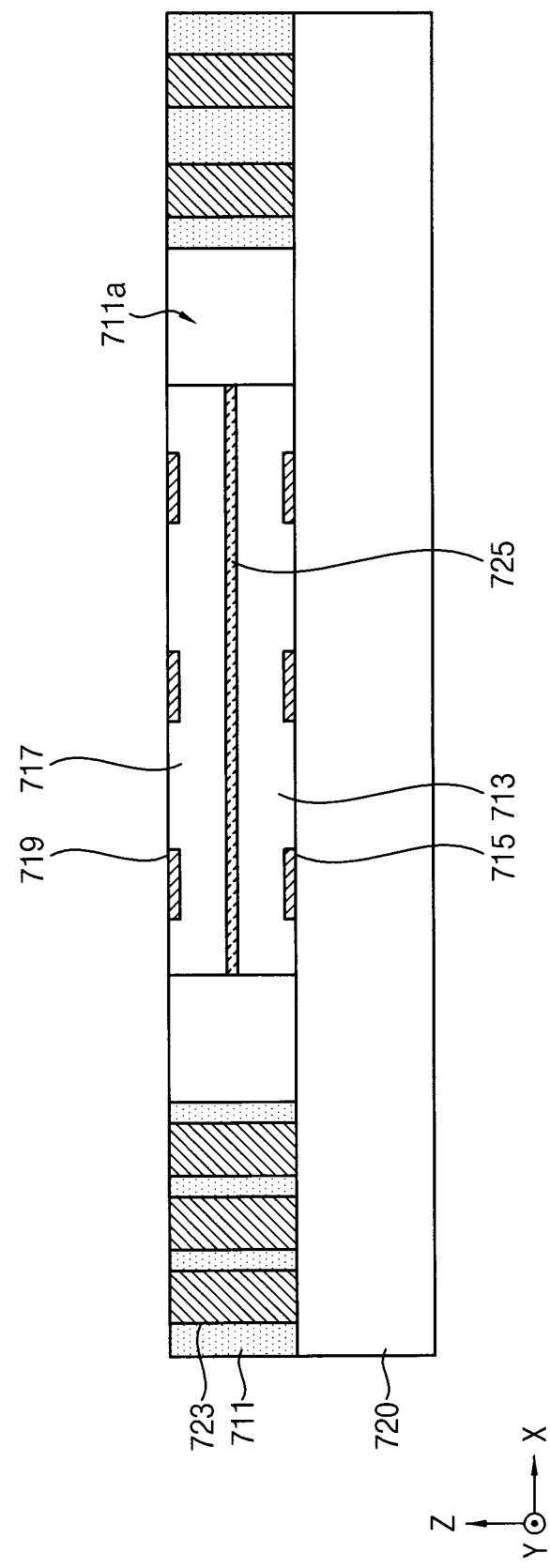

Referring to the exemplary embodiment of FIG. 11C, as with the exemplary embodiment of FIG. 3C, the core vias 723 are formed in the via-holes 711b of the core member 711, and the first and second semiconductor chips 713 and 717 and the adhesive member 725 are disposed in the through-hole 711a of the core member 711. The carrier 720 may be used for disposing the first and second semiconductor chips 713 and 717 and the adhesive member 725 in the through-hole 711a. In an exemplary embodiment, the first semiconductor chip 713, the adhesive member 725 and the second semiconductor chip 717 may be sequentially disposed in the through-hole 711a (e.g., in the Z direction), or the first and second semiconductor chips 713 and 717 may be first attached by the adhesive member 725 outside of the through-hole 711a and then the first and second semiconductor chips 713 and 717 and the adhesive member 725 may be disposed in the through-hole 711a in one step.

Figure 11D:
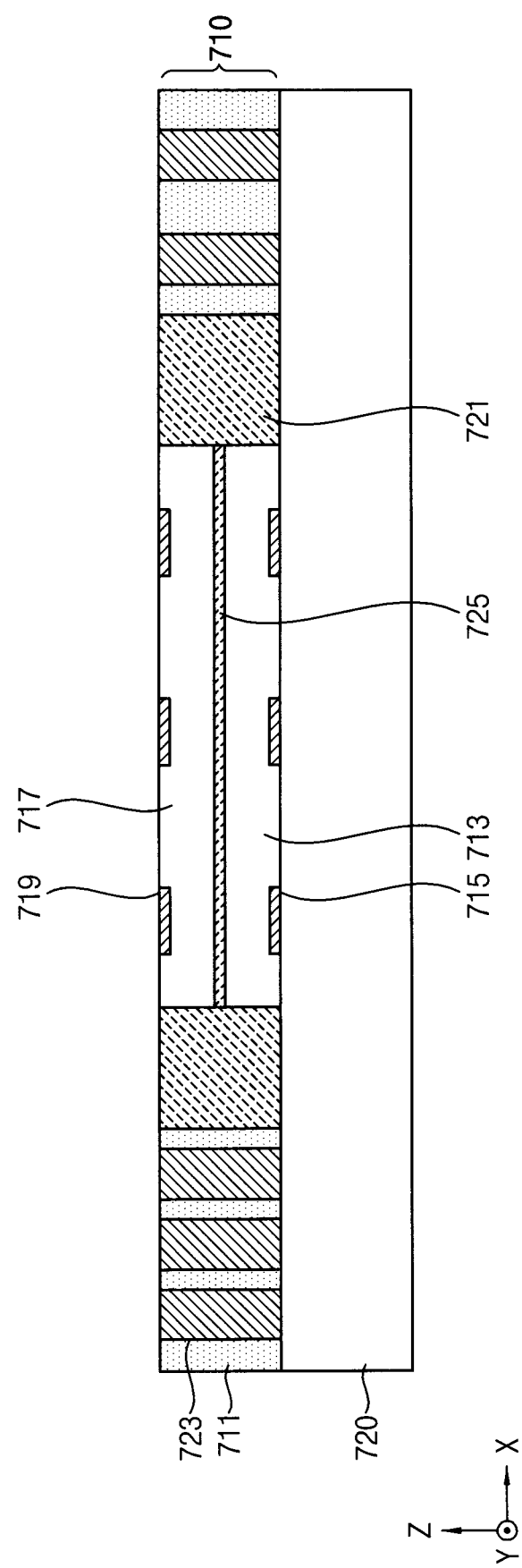

Referring to the exemplary embodiment of FIG. 11D, as with the exemplary embodiment of FIG. 3D, the encapsulant 721 for encapsulating the first and second semiconductor chips 713 and 717 is formed in the through-hole 711a of the core member 711, and thus the core layer 710 of the first package 700 is formed.

Figure 11E:
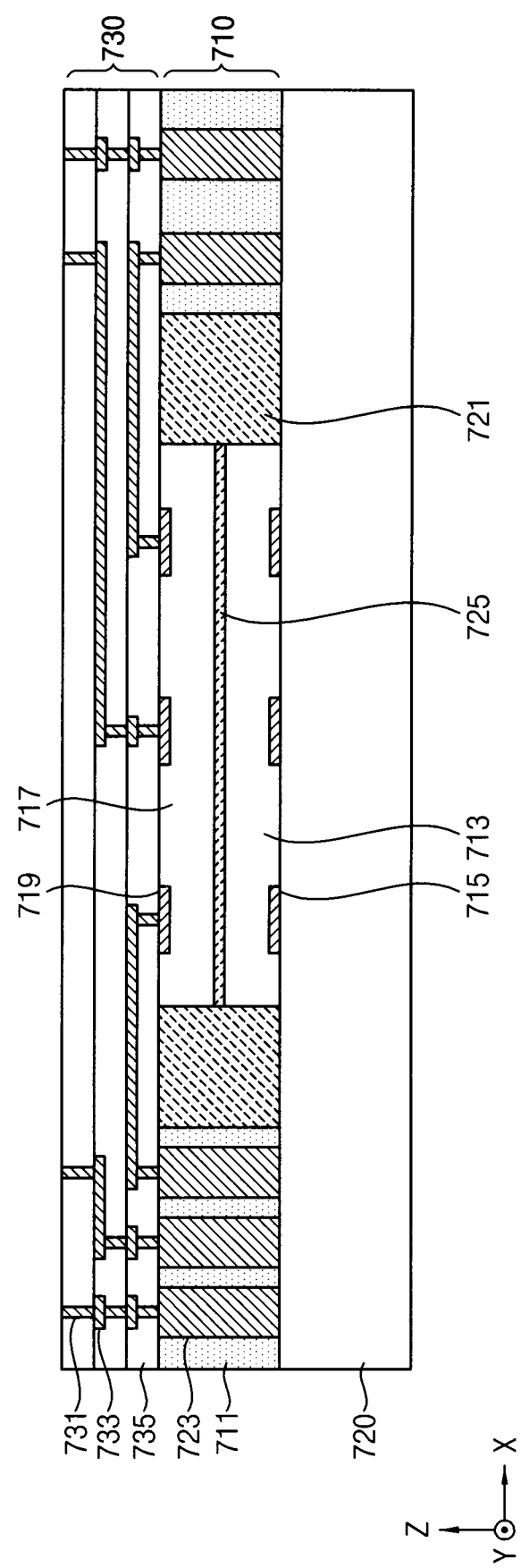
Figure 11F:
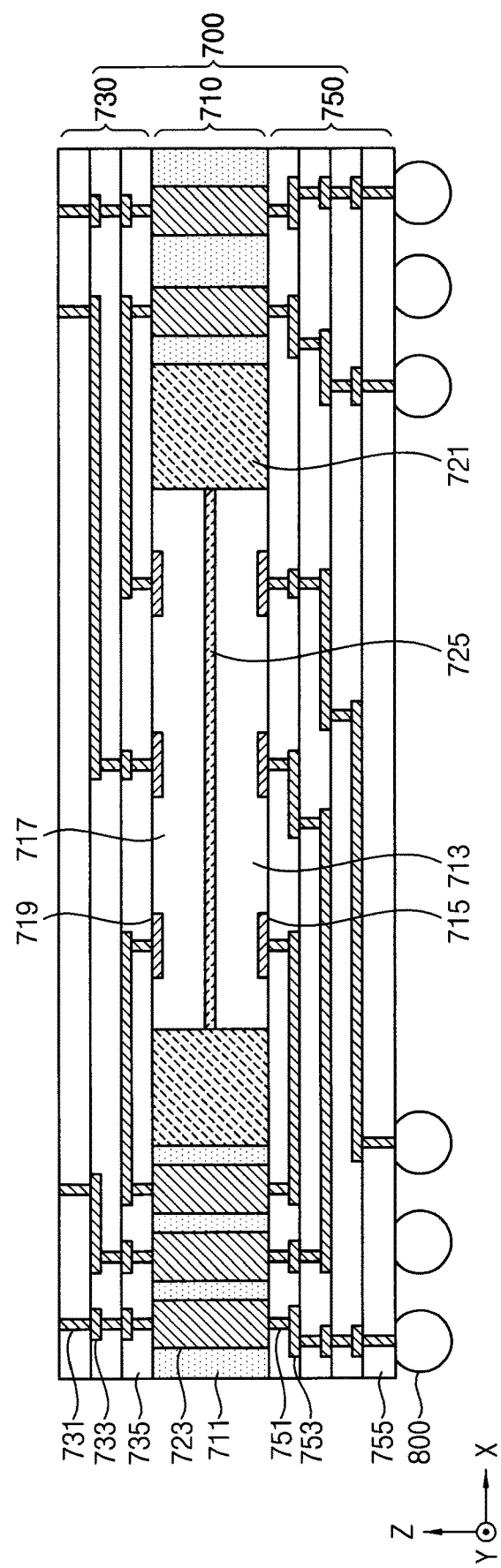

Referring to the exemplary embodiments of FIGS. 11E and 11F, as with the exemplary embodiments of FIGS. 3E and 3F, the first redistribution layer 730 is formed on the core member 711 (e.g., above the core member 711 in the Z direction), the second redistribution layer 750 is formed under the core member 711 (e.g., in the Z direction), and the plurality of second electrical connection structures 800 are formed under the second redistribution layer 750. As a result, a manufacturing process of the first package 700 is completed.

The second package 200 is manufactured as described with reference to the exemplary embodiments of FIGS. 5A, 5B and 5C. As illustrated in the exemplary embodiment of FIG. 10, the second package 200 is disposed on the first package 700 (e.g., in the Z direction), and the first package 700 and the second package 200 are electrically connected to each other using the plurality of first electrical connection structures 300. As a result, a manufacturing process of the semiconductor package 30 is completed.

Figure 12:
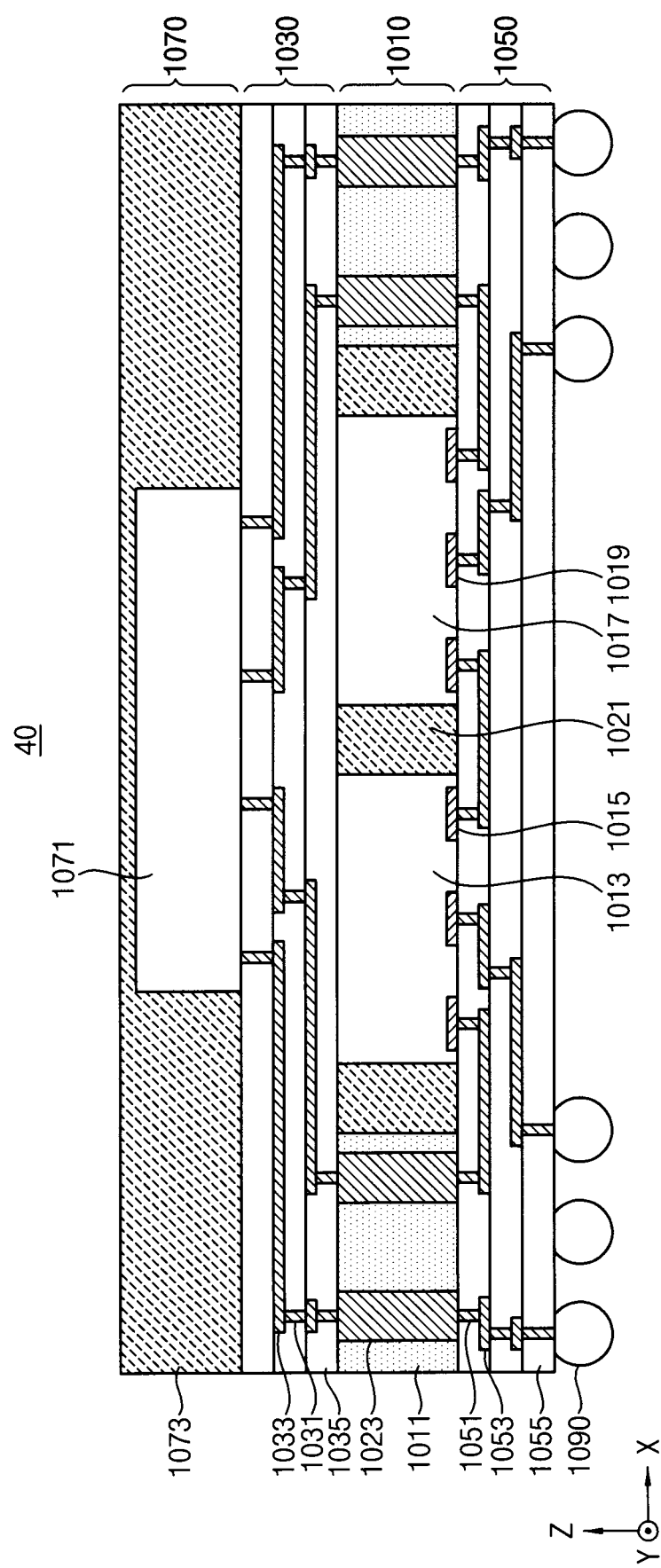
FIG. 12 is a cross-sectional view of a semiconductor package according to an exemplary embodiment of the present inventive concepts.

FIG. 12 is a cross-sectional view of a semiconductor package according to an exemplary embodiment of the present inventive concepts. The description of elements substantially similar or identical to the elements included in the exemplary embodiment of FIG. 1 will be omitted for convenience of explanation.

Referring to the exemplary embodiment of FIG. 12, a semiconductor package 40 includes a core layer 1010, a first redistribution layer 1030, a second redistribution layer 1050, a first layer 1070 and a plurality of electrical connection structures 1090.

The core layer 1010 includes a core member 1011, a first semiconductor chip 1013, a second semiconductor chip 1017, an encapsulant 1021 and core vias 1023.

The core member 1011 may be substantially the same as the core member 111 in the exemplary embodiment of FIG. 1. The core member 1011 includes a through-hole (e.g., a through-hole 1011a in FIG. 13B). In the exemplary embodiment of FIG. 12, both of the first and second semiconductor chips 1013 and 1017 may be disposed inside the through-hole 1011a of the core member 1011.

The first and second semiconductor chips 1013 and 1017 may be substantially the same as the first and second semiconductor chips 113 and 171 in the exemplary embodiment of FIG. 1, respectively. The first and second semiconductor chips 1013 and 1017 are disposed in the through-hole 1011a of the core member 1011. For example, the first and second semiconductor chips 1013 and 1017 may be disposed adjacent to each other in a horizontal direction (e.g., in the X direction) in the through-hole 1011a. The first semiconductor chip 1013 may include a first active surface having first pads 1015 disposed thereon and a first inactive surface opposite to the first active surface. The second semiconductor chip 1017 may include a second active surface having second pads 1019 disposed thereon and a second inactive surface opposite to the second active surface. For example, as shown in the exemplary embodiment of FIG. 12, the first and second active surfaces may be disposed on the lower surfaces (e.g., in the Z direction) of the first and second semiconductor chips 1013, 1017 and the first and second inactive surfaces may be disposed on the upper surfaces (e.g., in the Z direction) of the first and second semiconductor chips 1013, 1017.

For example, in the exemplary embodiment of FIG. 12, the first semiconductor chip 1013 is disposed in face-down form such that the first active surface faces downwards, and the second semiconductor chip 1017 may be disposed in face-down form such that the second active surface faces downwards. However, exemplary embodiments of the present inventive concepts are not limited thereto. For example, in another exemplary embodiment, at least one of the first and second semiconductor chips 1013 and 1017 may be disposed in face-up form.

In an exemplary embodiment, as illustrated in FIG. 8, one of the first and second semiconductor chips 1013 and 1017 may be implemented in a 3D integration semiconductor chip. In another exemplary embodiment, as illustrated in FIG. 10, the first and second semiconductor chips 1013 and 1017 may be stacked in the Z direction (e.g. a vertical direction) in the through-hole 1011a.

The encapsulant 1021 may be substantially the same as the encapsulant 117 encapsulating the first semiconductor chip 113 in the exemplary embodiment of FIG. 1. The encapsulant 1021 may encapsulate both the first and second semiconductor chips 1013 and 1017. The core vias 1023 may be substantially the same as the core vias 119 in the exemplary embodiment of FIG. 1.

The first redistribution layer 1030 may be substantially the same as the first redistribution layer 130 in the exemplary embodiment of FIG. 1. The first redistribution layer 1030 may include a plurality of vias 1031, a plurality of wirings 1033 and a plurality of insulating layers 1035. The second redistribution layer 1050 may be substantially the same as the second redistribution layer 150 in the exemplary embodiment of FIG. 1. The second redistribution layer 1050 may include a plurality of vias 1051, a plurality of wirings 1053 and a plurality of insulating layers 1055. The plurality of electrical connection structures 1090 may be substantially the same as the plurality of second electrical connection structures 400 in the exemplary embodiment of FIG. 1.

The first layer 1070 includes a third semiconductor chip 1071 and an encapsulant 1073 that encapsulates the third semiconductor chip 1071.

The third semiconductor chip 1071 may be substantially the same as the third semiconductor chip 230 in FIG. 1. The third semiconductor chip 1071 may be disposed on the first redistribution layer 1030. The encapsulant 1073 may be substantially the same as the encapsulant 250 in the exemplary embodiment of FIG. 1.

In an exemplary embodiment, the semiconductor package 40 of FIG. 12 may be manufactured at one time through a continuous process. For example, unlike the exemplary embodiments of FIGS. 1, 8 and 10, the semiconductor package 40 of the exemplary embodiment of FIG. 12 may be manufactured by being integrated and/or combined through one process. For example, in the semiconductor package 40 of the exemplary embodiment of FIG. 12, the third semiconductor chip 230 may not be manufactured in a separate package, and the first redistribution layer 1030 may be used as a substrate for the placement of the third semiconductor chip 230. For example, the third semiconductor chip 230 may be disposed directly on the first redistribution layer 1030. A lower surface of the third semiconductor chip 230 may be disposed directly on an upper surface of the first redistribution layer 1030. In this exemplary embodiment, the core layer 1010, the first redistribution layer 1030 and the second redistribution layer 1050 may correspond to the first package 100 in the exemplary embodiment of FIG. 1. The first redistribution layer 1030 and the first layer 1070 may correspond to the second package 200 in the exemplary embodiment of FIG. 1. As compared with the exemplary embodiment of FIG. 1, the substrate 210 and the plurality of first electrical connection structures 300 may not be included in the semiconductor package 40 of the exemplary embodiment of FIG. 12. Therefore, a top surface of the first redistribution layer 1030 and a bottom surface of the third semiconductor chip 230 may be in direct contact with each other without being spaced apart from each other in the vertical direction Z.

The semiconductor package 40 according to an exemplary embodiment may be implemented with a PoP scheme in which a package structure implemented as a fan-out scheme and including the core layer 1010, the first redistribution layer 1030 and the second redistribution layer 1050 is used as a substrate and the third semiconductor chip 230 is disposed directly on the package structure (e.g., in the Z direction). In addition, the semiconductor package 40 may be implemented with an integrated PoP scheme in which the first redistribution layer 1030 in the package structure is used as a substrate for the placement of the third semiconductor chip 1071. Accordingly, a multi-function/integration structure may be efficiently implemented within a limited package area.

FIGS. 13A, 13B, 13C, 13D, 13E, 13F and 13G are cross-sectional views for describing a method of manufacturing a semiconductor package of FIG. 12 according to exemplary embodiments of the present inventive concepts. The description of elements substantially similar or identical to the elements included in the exemplary embodiments of FIGS. 3A, 3B, 3C, 3D, 3E, 3F, 3G and 3H will be omitted for convenience of explanation.

Figure 13B:
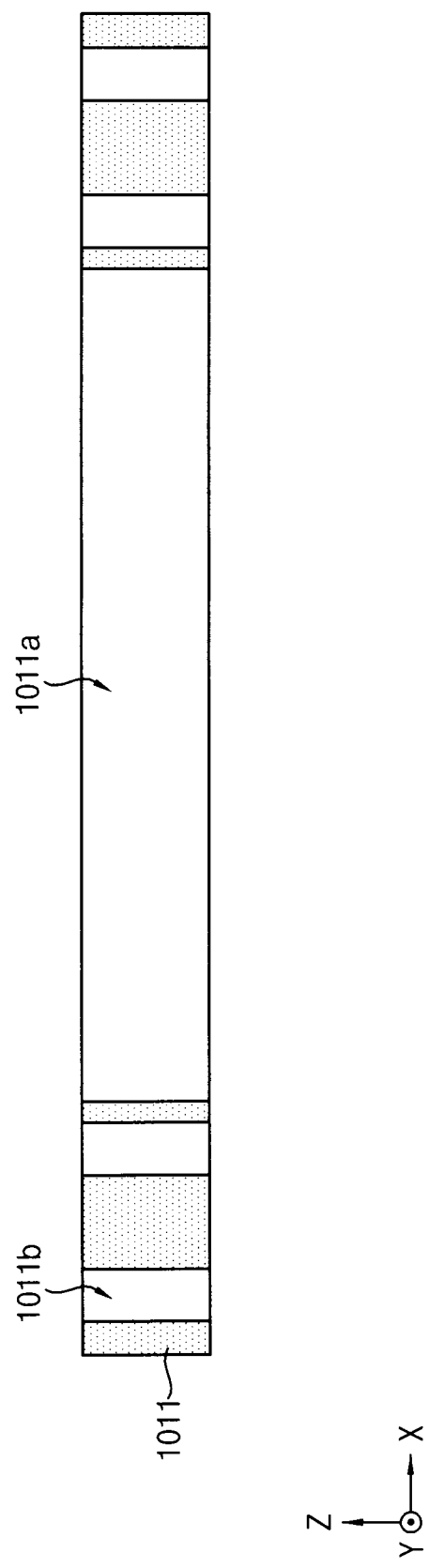

Referring to the exemplary embodiments of FIGS. 13A and 13B, similar to the exemplary embodiments of FIGS. 3A and 3B, the core member 1011 is provided, and the through-hole 1011a and via-holes 1011b penetrating the core member 1011 (e.g., in the Z direction) are formed.

Figure 13C:
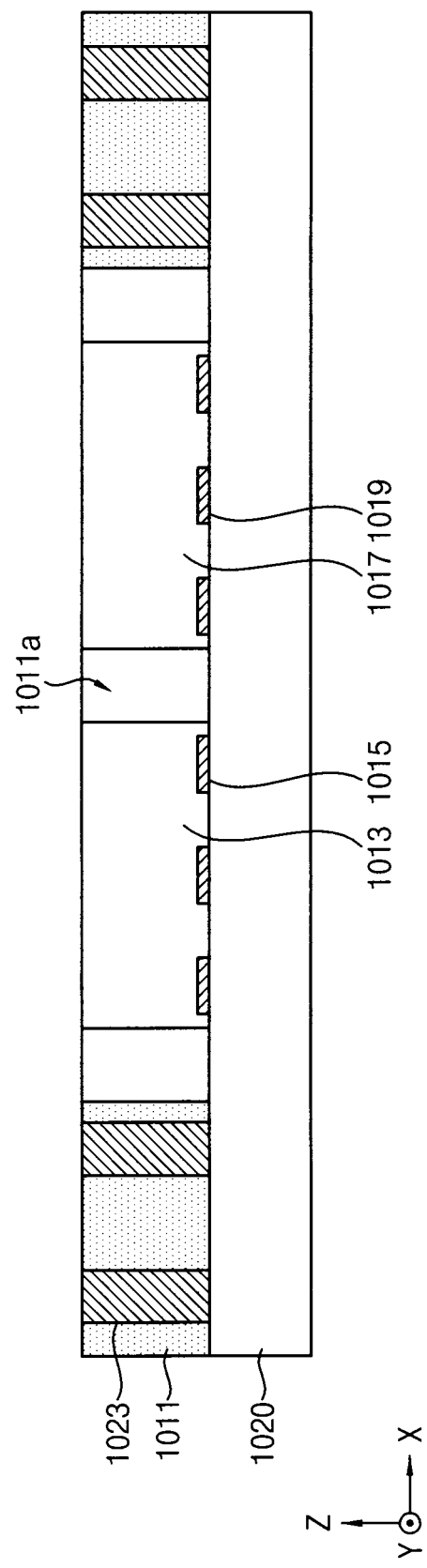

Referring to the exemplary embodiment of FIG. 13C, similar to the exemplary embodiment of FIG. 3C, the core vias 1023 are formed in the via-holes 1011b of the core member 1011, and the first and second semiconductor chips 1013 and 1017 are disposed in the through-hole 1011a of the core member 1011. The carrier 1020 may be used for disposing the first and second semiconductor chips 1013 and 1017 in the through-hole 1011a. In an exemplary embodiment, the first and second semiconductor chips 1013 and 1017 may be substantially simultaneously or sequentially disposed.

Figure 13D:
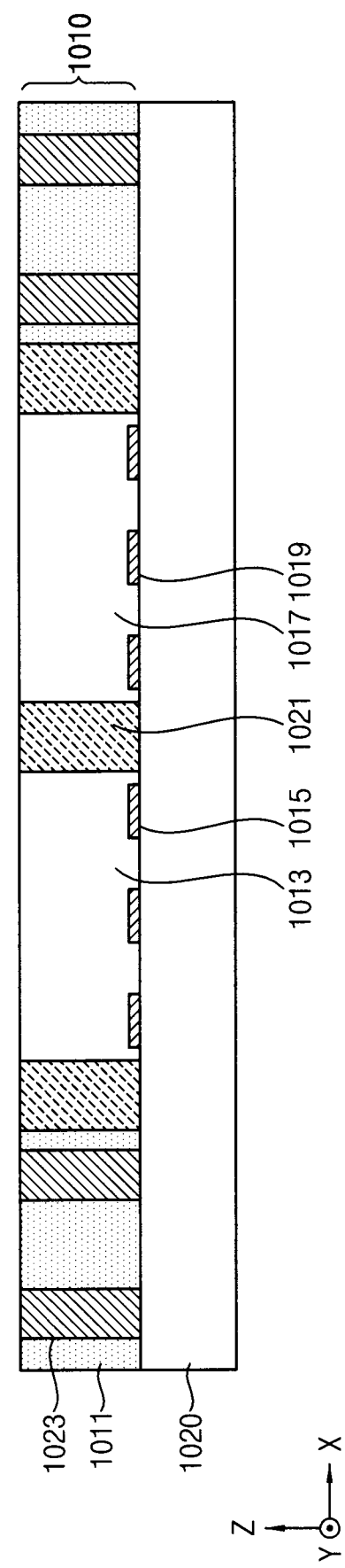

Referring to the exemplary embodiment of FIG. 13D, similar to the exemplary embodiment of FIG. 3D, the encapsulant 1021 for encapsulating the first and second semiconductor chips 1013 and 1017 is formed in the through-hole 1011a of the core member 1011, and thus the core layer 1010 is formed.

Figure 13E:
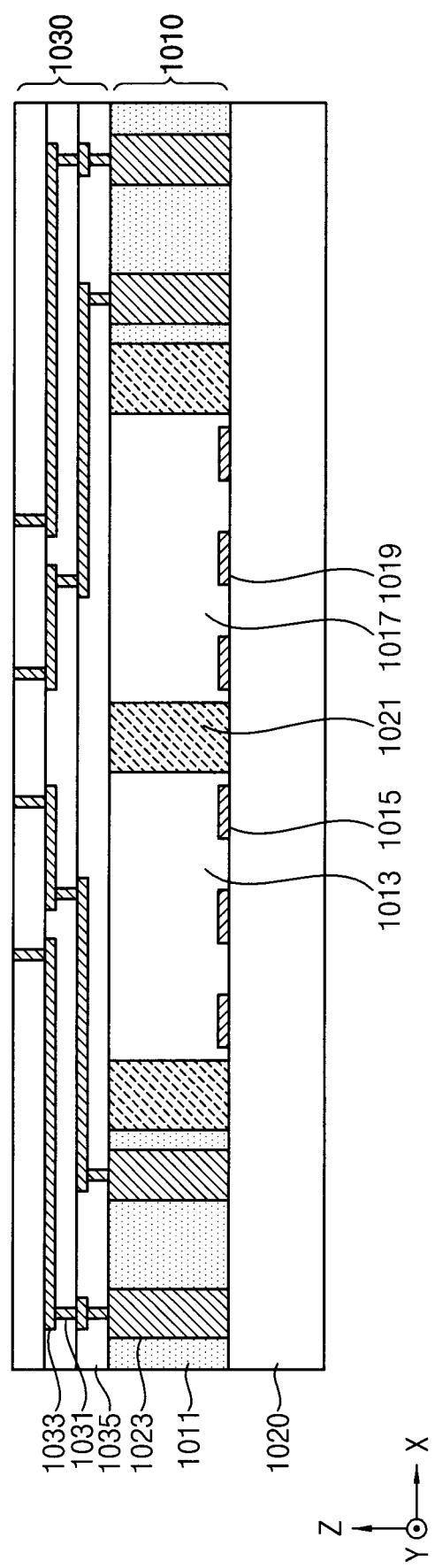
Figure 13F:
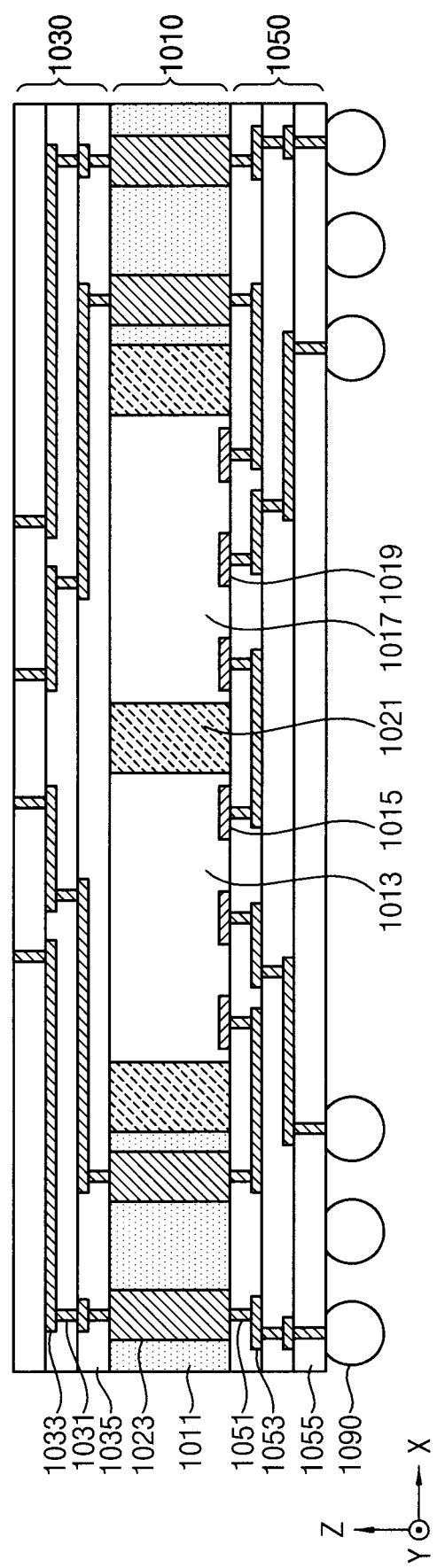

Referring to the exemplary embodiments of FIGS. 13E and 13F, similar to the exemplary embodiments of FIGS. 3E and 3F, the first redistribution layer 1030 is formed on the core member 1011, the second redistribution layer 1050 is formed under the core member 1011, and the plurality of electrical connection structures 1090 are formed under the second redistribution layer 1050.

Figure 13G:
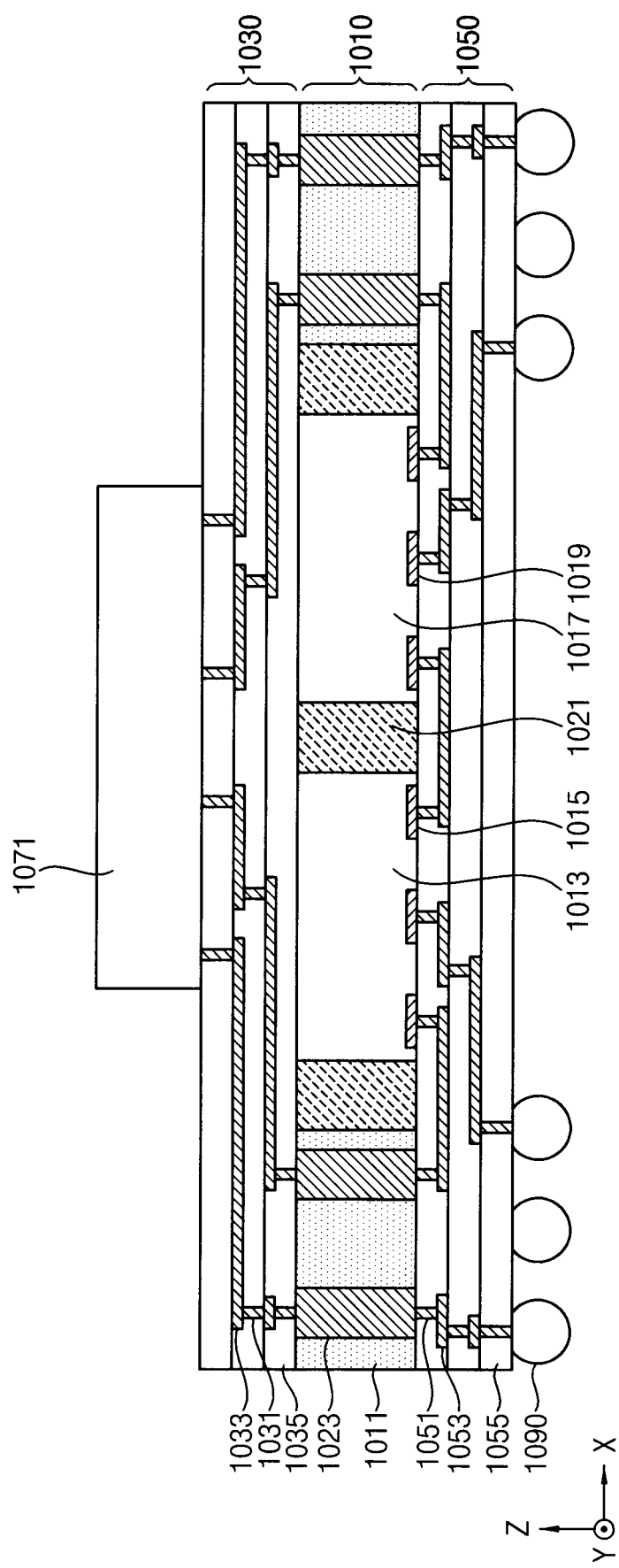

Referring to the exemplary embodiment of FIG. 13G, similar to the exemplary embodiment of FIG. 3G the third semiconductor chip 1071 is disposed on the first redistribution layer 1030. For example, a lower surface of the third semiconductor chip 1071 may be disposed on an upper surface of the first redistribution layer 1030. As shown in the exemplary embodiment of FIG. 13F, the lower surface of the third semiconductor chip 1071 may directly contact the upper surface of the first redistribution layer 1030.

As illustrated in the exemplary embodiment of FIG. 12, the encapsulant 1073 for encapsulating the third semiconductor chip 1071 is formed on the first redistribution layer 1030, and thus the first layer 1070 is formed. As a result, a manufacturing process of the semiconductor package 40 is completed.

Figure 14:
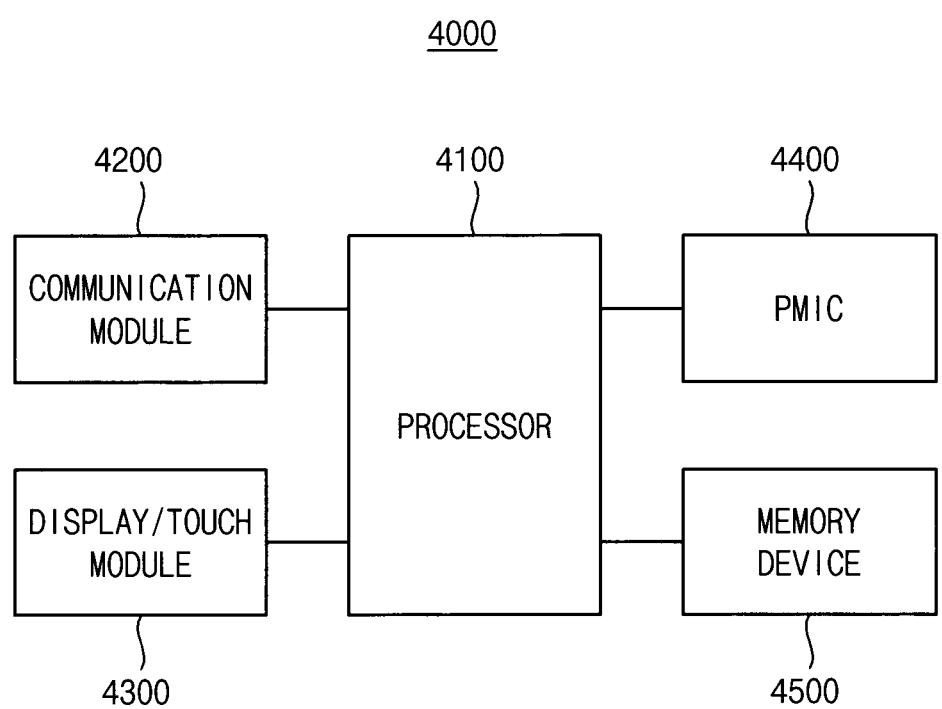
FIG. 14 is a block diagram illustrating an electronic system according to an exemplary embodiment of the present inventive concepts.

FIG. 14 is a block diagram illustrating an electronic system according to example embodiments.

Referring to the exemplary embodiment of FIG. 14, an electronic system 4000 includes at least one processor 4100, a communication module 4200, a display/touch module 4300, a PMIC 4400 and a memory device 4500. For example, the electronic system 4000 may be any mobile system or any computing system.

The processor 4100 controls operations of the electronic system 4000. In an exemplary embodiment, the processor 4100 may execute an operating system and at least one application to provide an internet browser, games, videos, or the like. The communication module 4200 is controlled by the processor 4100 and performs wireless or wire communications with an external system. The display/touch module 4300 displays data processed by the processor 4100 and/or receives data through a touch panel. The PMIC 4400 controls power of the electronic system 4000. The memory device 4500 stores user data and/or temporarily stores data used for processing operations of the electronic system 4000.

At least portions of the electronic system 4000 may be implemented in the form of the semiconductor package according to the exemplary embodiments of the present inventive concepts. For example, each of the processor 4100 and the PMIC 4400 may correspond to one of the first and second semiconductor chips included in the semiconductor package according to exemplary embodiments of the present inventive concepts, and the memory device 4500 may correspond to the third semiconductor chip included in the semiconductor package according to exemplary embodiments of the present inventive concepts.

The present inventive concepts may be applied to various electronic devices and/or systems including the semiconductor packages. For example, the present inventive concepts may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc. However, exemplary embodiments of the present inventive concepts are not limited thereto.

The foregoing is illustrative of exemplary embodiments of the present inventive concepts and is not to be construed as limiting thereof. Although some exemplary embodiments have been described, those skilled in the art will readily appreciate that many modifications are possible in the exemplary embodiments without departing from the present inventive concepts. Accordingly, all such modifications are intended to be included within the scope of the present inventive concepts. Therefore, it is to be understood that the foregoing is illustrative of various exemplary embodiments and the present inventive concepts are not to be construed as limited to the specifically described exemplary embodiments.

What is claimed is:

1. A semiconductor package comprising:
a core member including a through-hole, the core member of comprising a PCB substrate;
a first semiconductor chip and a second semiconductor chip disposed in the through-hole, the first semiconductor chip and the second semiconductor chip include first pads and second pads respectively, wherein the first and second pads on a lower surface of the first and second semiconductor chips;
a first encapsulant disposed in the through-hole and encapsulating the first and second semiconductor chips, wherein the first encapsulant directly surrounds sides of the first and second semiconductor chips, the first encapsulant comprises a photoimagable encapsulant, and the core member and the first encapsulant are composed of different materials from each other;
a first redistribution layer disposed above the core member and an upper surface of the first and second semiconductor chips, wherein the first redistribution layer is electrically connected to at least one of the first and second semiconductor chips, and includes a plurality of vias, a plurality of wirings and a plurality of insulating layers;
a second redistribution layer disposed under the core member and the lower surface of the first and second semiconductor chips, wherein the second redistribution layer includes a plurality of vias, and a plurality of wirings for redistributing the first pads and second pads of the first and second semiconductor chips;
core vias penetrating the core member and directly contacting vias of the plurality of vias and insulating layers of the plurality of insulating layers of the first redistribution layer and the second redistribution layer, wherein the core vias are configured to electrically connect the first redistribution layer with the second redistribution layer;
a third semiconductor chip disposed directly on the first redistribution layer such that pads of the third semiconductor chip face the first redistribution layer;
a second encapsulant disposed directly on the first redistribution layer and encapsulating the third semiconductor chip; and
a plurality of electrical connection structures disposed under the second redistribution layer,
wherein the third semiconductor chip at least partially overlaps with each of the first semiconductor chip and the second conductor chip.

2. The semiconductor package of claim 1, wherein:
the first and second semiconductor chips are disposed adjacent to each other in a horizontal direction in the through-hole.

3. The semiconductor package of claim 2, wherein:
the first semiconductor chip is a three-dimensional (3D) integration semiconductor chip.

4. The semiconductor package of claim 3, wherein:
the first semiconductor chip is implemented by stacking first and second semiconductor devices performing different functions in a vertical direction.

5. The semiconductor package of claim 4, wherein:
the first semiconductor device of the first semiconductor chip includes an active element, and the second semiconductor device of the first semiconductor chip includes a passive element.

6. The semiconductor package of claim 5, wherein:
the first semiconductor device includes an AP or a PMIC, and the second semiconductor device includes a capacitor.

7. The semiconductor package of claim 1, wherein the second encapsulant directly contacts an entirety of an upper surface of the third semiconductor chip.

8. The semiconductor package of claim 1, wherein the third semiconductor chip is in contact with one or more vias of the plurality of vias of the first redistribution layer.

9. A semiconductor package comprising:
a core member including a through-hole, the core member comprising a PCB substrate;
a first semiconductor chip and a second semiconductor chip disposed in the through-hole, the first semiconductor chip includes a first active surface and a first inactive surface, and the second semiconductor chip includes a second active surface and a second inactive surface;
a first encapsulant disposed in the through-hole and encapsulating the first and second semiconductor chips, wherein the first encapsulant directly surrounds sides of the first and second semiconductor chips, the first encapsulant comprises a photoimagable encapsulant, and the core member and the first encapsulant are composed of different materials from other;
a first redistribution layer disposed above the core member, the first inactive surface of the first semiconductor chip, and the second inactive surface of the second semiconductor chip, wherein the first redistribution layer is electrically connected to at least one of the first and second semiconductor chips, and includes a plurality of vias, a plurality of wirings and a plurality of insulating layers;
a second redistribution layer disposed under the core member, the first active surface of the first semiconductor chip, and the second active surface of the second semiconductor chip, wherein the second redistribution layer includes a plurality of vias, a plurality of wirings and a plurality of insulating layers;
core vias penetrating the core member and directly contacting vias of the plurality of vias and insulating layers of the plurality of insulating layers of the first redistribution layer and the second redistribution layer, wherein the core vias are configured to electrically connect the first redistribution layer with the second redistribution layer;

a third semiconductor chip disposed directly on the first redistribution layer such that pads of the third semiconductor chip face the first redistribution layer;

a second encapsulant disposed directly on the first redistribution layer and encapsulating the third semiconductor chip; and a plurality of electrical connection structures disposed under the second redistribution layer, wherein the third semiconductor chip at least partially overlaps with each of the first semiconductor chip and the second conductor chip.

10. The semiconductor package of claim 9, wherein: the first semiconductor chip is a three-dimensional (3D) integration semiconductor chip.

11. The semiconductor package of claim 10, wherein: the first semiconductor chip is implemented by stacking first and second semiconductor devices performing different functions in a vertical direction.

12. The semiconductor package of claim 9, wherein the second encapsulant directly contacts an entirety of an upper surface of the third semiconductor chip.

13. The semiconductor package of claim 9, wherein the third semiconductor chip is in contact with one or more vias of the plurality of vias of the first redistribution layer.

* * * * *